(12) United States Patent
Lee et al.

(10) Patent No.: US 11,935,486 B2
(45) Date of Patent: Mar. 19, 2024

(54) SCAN SIGNAL GENERATION CIRCUIT AND DISPLAY DEVICE INCLUDING THE SAME

(71) Applicant: LG Display Co., Ltd., Seoul (KR)

(72) Inventors: Jae Young Lee, Seoul (KR); Dae Sung Jung, Suwon-si (KR); Sung Woo Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/985,118

(22) Filed: Nov. 10, 2022

(65) Prior Publication Data

US 2023/0215375 A1  Jul. 6, 2023

(30) Foreign Application Priority Data

Dec. 31, 2021  (KR) .................. 10-2021-0194663

(51) Int. Cl.
*G09G 3/30* (2006.01)
*G09G 3/3266* (2016.01)
*G09G 3/36* (2006.01)

(52) U.S. Cl.
CPC ... *G09G 3/3266* (2013.01); *G09G 2300/0426* (2013.01); *G09G 2300/0852* (2013.01); *G09G 2310/0286* (2013.01)

(58) Field of Classification Search
CPC ......... G09G 3/3266; G09G 2300/0426; G09G 2300/0826
See application file for complete search history.

(56) References Cited

U.S. PATENT DOCUMENTS

| | | | |
|---|---|---|---|
| 2014/0198022 A1* | 7/2014 | Chou | G09G 3/3677 345/92 |
| 2015/0170592 A1* | 6/2015 | Bai | G09G 3/3677 345/100 |
| 2018/0233098 A1* | 8/2018 | Du | G02F 1/13 |
| 2020/0380911 A1* | 12/2020 | Park | G09G 3/32 |
| 2021/0056910 A1* | 2/2021 | Chung | G11C 19/28 |

* cited by examiner

*Primary Examiner* — Sanghyuk Park
(74) *Attorney, Agent, or Firm* — Fenwick & West LLP

(57) ABSTRACT

The present disclosure provides a display device including a display panel and a scan signal generator configured to generate a (1-1)th scan signal and a (1-2)th scan signal to be supplied to a first horizontal line of the display panel and a (2-1)th scan signal and a (2-2)th scan signal to be supplied to a second horizontal line of the display panel, wherein the scan signal generator includes a switch circuit, and an output circuit.

26 Claims, 17 Drawing Sheets

SCAN SIGNAL GENERATION CIRCUIT AND DISPLAY DEVICE INCLUDING THE SAME

CROSS-REFERENCE TO RELATED APPLICATIONS

This application claims the benefit of Republic of Korea Patent Application No. 10-2021-0194663, filed on Dec. 31, 2021, which is hereby incorporated by reference as if fully set forth herein.

BACKGROUND

Technical Field

The present disclosure relates to a scan signal generation circuit and a display device including the same.

Discussion of the Related Art

With the development of information technology, the market for display devices, which are connection media between users and information, is growing. Accordingly, display devices such as a light emitting display (LED) device, a quantum dot display (QDD) device, and a liquid crystal display (LCD) device is increasingly used.

The display devices described above include a display panel including sub-pixels, a driver outputting driving signals for driving the display panel, a power supply generating power to be supplied to the display panel or the driver, and the like.

In the aforementioned display devices, when driving signals, for example, a scan signal and a data signal, are supplied to sub-pixels formed in the display panel, selected sub-pixels transmit light or directly emit light, thereby displaying an image.

SUMMARY

An object of the present disclosure is to reduce the circuit area of a shift register for outputting a scan signal by grouping and integrating a total of four scan signal generators included in two stages to construct one integrated scan signal generation circuit, and reduce the size of a bezel of a display panel according to reduction in the circuit area of the shift register.

To achieve these objects and other advantages and in accordance with the purpose of the disclosure, as embodied and broadly described herein, a display device includes a display panel, and a scan signal generator configured to generate a (1-1)th scan signal and a (1-2)th scan signal to be supplied to a first horizontal line of the display panel and a (2-1)th scan signal and a (2-2)th scan signal to be supplied to a second horizontal line of the display panel, wherein the scan signal generator includes a switch circuit including a common node charged with a low voltage applied by turn-on operations of a first transistor and a second transistor, an inverting node operating opposite to the common node, and first to fourth stabilization transistors having first electrodes connected to the common node, and gate electrodes connected to a gate low voltage line, and an output circuit including a (1-1)th pull-up transistor and a (1-2)th pull-up transistor that output the (1-1)th scan signal and the (1-2)th scan signal in response to a voltage of a first node corresponding to a second electrode of the first stabilization transistor and a voltage of a second node corresponding to a second electrode of the second stabilization transistor, and a (2-1)th pull-up transistor and a (2-2)th pull-up transistor that output the (2-1)th scan signal and the (2-2)th scan signal in response to a voltage of a third node corresponding to a second electrode of the third stabilization transistor and a voltage of a fourth node corresponding to a second electrode of the fourth stabilization transistor.

The (1-1)th pull-up transistor may have a gate electrode connected to the first node, a first electrode connected to a (1-1)th clock signal line, and a second electrode connected to a (1-1)th output terminal, the (1-2)th pull-up transistors may have a gate electrode connected to the second node, a first electrode connected to a (1-2)th clock signal line, and a second electrode connected to a (1-2)th output terminal, the (2-1)th pull-up transistor may have a gate electrode connected to the third node, a first electrode connected to a (2-1)th clock signal line, and a second electrode connected to a (2-1)th output terminal, and the (2-2)th pull-up transistor may have a gate electrode connected to the fourth node, a first electrode connected to a (2-2)th clock signal line, and a second electrode connected to a (2-2) output terminal.

The output circuit may include a (1-1)th pull-down transistor having a gate electrode connected to the inverting node, a first electrode connected to a gate high voltage line, and a second electrode connected to the (1-1)th output terminal, a (1-2)th pull-down transistor having a gate electrode connected to the inverting node, a first electrode connected to the gate high voltage line, and a second electrode connected to the (1-2)th output terminal, a (2-1)th pull-down transistor having a gate electrode connected to the inverting node, a first electrode connected to the gate high voltage line, and a second electrode connected to the (2-1)th output terminal, and a (2-2)th pull-down transistor having a gate electrode connected to the inverting node, a first electrode connected to the gate high voltage line, and a second electrode connected to the (2-2)th output terminal.

The output circuit may include a (1-1)th capacitor having a first electrode connected to the gate electrode of the (1-1)th pull-up transistor and a second electrode connected to the (1-1)th output terminal, a (1-2)th capacitor having a first electrode connected to the gate electrode of the (1-2)th pull-up transistor and a second electrode connected to the (1-2)th output terminal, a (2-1)th capacitor having a first electrode connected to the gate electrode of the (2-1)th pull-up transistor and a second electrode connected to the (2-1)th output terminal, and a (2-2)th capacitor having a first electrode connected to the gate electrode of the (2-2)th pull-up transistor and a second electrode connected to the (2-2)th output terminal.

The first transistor may have a gate electrode connected to a start signal line and a first electrode connected to the gate low voltage line, and the second transistor may have a gate electrode connected to a common node clock signal line, a first electrode connected to a second electrode of the first transistor, and a second electrode connected to the common node.

The switch circuit may include a third transistor having a gate electrode connected to the inverting node, a first electrode connected to the gate high voltage line, and a second electrode connected to the common node, a fourth transistor having a gate electrode connected to an inverting node clock signal line, a first electrode connected to the gate low voltage line, and a second electrode connected to the inverting node, a fifth transistor having a gate electrode connected to the start signal line, a first electrode connected to the gate high voltage line, and a second electrode connected to the inverting node, an eighth transistor having a gate electrode connected to the common node, a first electrode connected to the gate high voltage line, and a second electrode connected to the common node, a ninth transistor having a gate electrode connected to a reset signal line, a first electrode connected to the gate high voltage line, and a second electrode connected to the common node, and a node capacitor having a first electrode connected to the gate high voltage line and a second electrode connected to the inverting node.

A period in which the (1-1)th scan signal maintains a low voltage and a period in which the (2-1)th scan signal maintains a low voltage may not overlap, and a period in which the (1-2)th scan signal maintains a low voltage and a period in which the (2-2)th scan signal maintains a low voltage may partially overlap.

In another aspect of the present disclosure, a scan signal generation circuit includes a switch circuit including a common node charged with a low voltage applied by turn-on operations of a first transistor and a second transistor, an inverting node operating opposite to the common node, and first to fourth stabilization transistors having first electrodes connected to the common node, and gate electrodes connected to a gate low voltage line, and an output circuit including a (1-1)th pull-up transistor and a (1-2)th pull-up transistor that output the (1-1)th scan signal and the (1-2)th scan signal in response to a voltage of a first node corresponding to a second electrode of the first stabilization transistor and a voltage of a second node corresponding to a second electrode of the second stabilization transistor, and a (2-1)th pull-up transistor and a (2-2)th pull-up transistor that output the (2-1)th scan signal and the (2-2)th scan signal in response to a voltage of a third node corresponding to a second electrode of the third stabilization transistor and a voltage of a fourth node corresponding to a second electrode of the fourth stabilization transistor.

The (1-1)th pull-up transistor may have a gate electrode connected to the first node, a first electrode connected to a (1-1)th clock signal line, and a second electrode connected to a (1-1)th output terminal, the (1-2)th pull-up transistor may have a gate electrode connected to the second node, a first electrode connected to a (1-2)th clock signal line, and a second electrode connected to a (1-2)th output terminal, the (2-1)th pull-up transistor may have a gate electrode connected to the third node, a first electrode connected to a (2-1)th clock signal line, and a second electrode connected to a (2-1)th output terminal, and the (2-2)th pull-up transistor may have a gate electrode connected to the fourth node, a first electrode connected to a (2-2)th clock signal line, and a second electrode connected to a (2-2)th output terminal.

The output circuit may include a (1-1)th pull-down transistor having a gate electrode connected to the inverting node, a first electrode connected to a gate high voltage line, and a second electrode connected to the (1-1)th output terminal, a (1-2)th pull-down transistor having a gate electrode connected to the inverting node, a first electrode connected to the gate high voltage line, and a second electrode connected to the (1-2)th output terminal, a (2-1)th pull-down transistor having a gate electrode connected to the inverting node, a first electrode connected to the gate high voltage line, and a second electrode connected to the (2-1)th output terminal, a (2-2)th pull-down transistor having a gate electrode connected to the inverting node, a first electrode connected to the gate high voltage line, and a second electrode connected to the (2-2)th output terminal, a (1-1)th capacitor having a first electrode connected to the gate electrode of the (1-1)th pull-up transistor and a second electrode connected to the (1-1)th output terminal, a (1-2)th capacitor having a first electrode connected to the gate electrode of the (1-2)th pull-up transistor and a second electrode connected to the (1-2)th output terminal, a (2-1)th capacitor having a first electrode connected to the gate electrode of the (2-1)th pull-up transistor and a second electrode connected to the (2-1)th output terminal, and a (2-2)th capacitor having a first electrode connected to the gate electrode of the (2-2)th pull-up transistor and a second electrode connected to the (2-2)th output terminal.

In another aspect, a scan signal generation circuit includes a switch circuit configured to receive a (6-2)th clock signal applied to a common node clock signal line, wherein responsive to the (6-2)th clock signal transitioning from a first state to a second state at a first time, the switch circuit is configured to charge one or more QN nodes for a first gate line and a second gate line of a display panel from a first state to a second state, and an output circuit connected to the one or more QN nodes, the output circuit configured to receive at least one first clock signal and at least one second clock signal, wherein responsive to the first clock signal transitioning from a first state to a second state at a second time after the first time, the output circuit is configured to transition a first gate signal applied to the first gate line to a second state, and responsive to the second clock signal transitioning from a first state to a second state at a third time after the second time, transition a second gate signal applied to the second gate line to a second state.

DETAILED DESCRIPTION

A display device according to the present disclosure may be implemented as a television, a video player, a personal computer (PC), a home theater, an automobile electric device, a smartphone, and the like, but is not limited thereto.

The display device according to the present disclosure may be implemented as a light emitting display (LED) device, a quantum dot display (QDD) device, a liquid crystal display (LCD) device, or the like. However, for convenience of description, an example in which a light emitting display device that directly emits light based on inorganic light emitting diodes or organic light emitting diodes will be described.

In addition, although a p-type thin film transistor will be described below, an n-type thin film transistor or a structure in which n-type and p-type thin film transistors are present together may be used. The thin film transistor is a three-electrode element including a gate, a source, and a drain. The source is an electrode that supplies carriers to the transistor. In the thin film transistor, carriers begin to flow from the source. The drain is an electrode through which carriers exit the thin film transistor. That is, in the thin film transistor, carriers flow from the source to the drain.

In the case of the p-type thin film transistor, carriers are holes and thus a source voltage is higher than a drain voltage such that holes can flow from the source to the drain. In the p-type thin film transistor, since holes flow from the source to the drain, current flows from the source to the drain. On the other hand, in the case of the n-type thin film transistor, the source voltage is lower than the drain voltage such that electrons can flow from the source to the drain because carriers are electrons. In the n-type thin film transistor, since electrons flow from the source to the drain, current flows from the drain to the source. However, the source and drain of a thin film transistor may be changed according to an applied voltage. Accordingly, in the following description, any one of the source and the drain will be described as a first electrode, and the other one of the source and the drain will be described as a second electrode.

Figure 1:
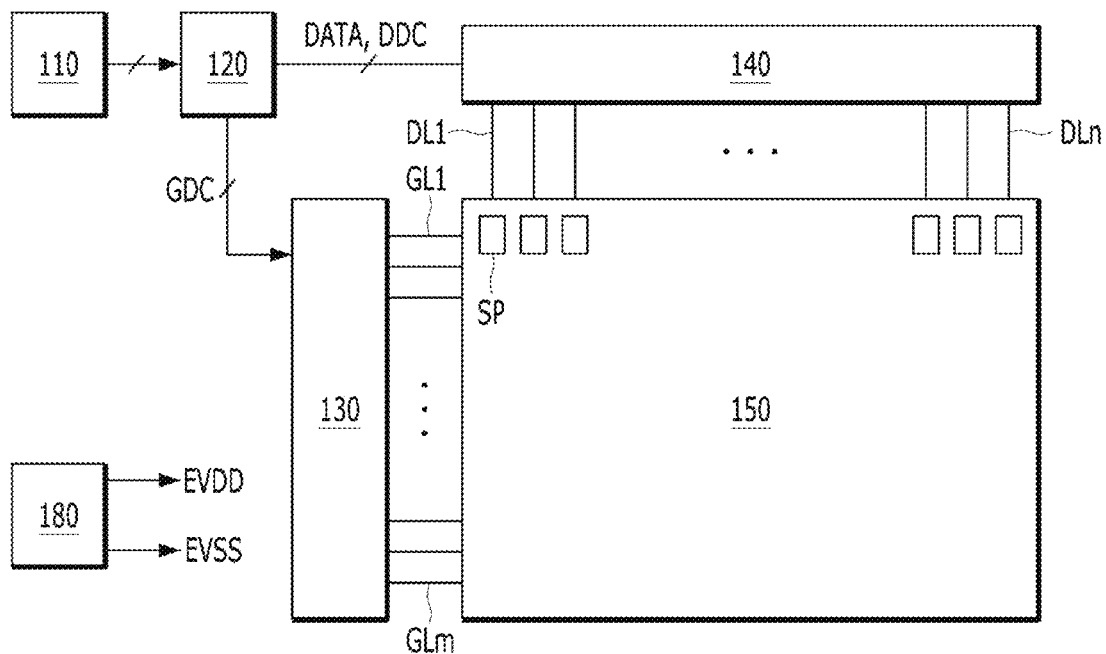
FIG. 1 is a block diagram schematically showing a light emitting display device.
Figure 2:
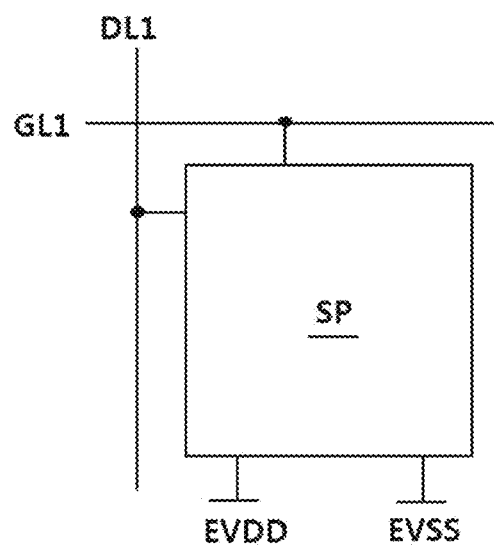
FIG. 2 is a configuration diagram schematically showing a sub-pixel shown in FIG. 1, according to an embodiment.

FIG. 1 is a block diagram schematically showing a light emitting display device, and FIG. 2 is a configuration diagram schematically showing a sub-pixel shown in FIG. 1, according to an embodiment.

As shown in FIGS. 1 and 2, the light emitting display device includes an image provider 110, a timing controller 120, a gate driver 130, a data driver 140, a display panel 150, a power supply 180, and the like.

The image provider (set or host system) 110 may output various driving signals along with an image data signal supplied from the outside or an image data signal stored in an internal memory. The image provider 110 may supply a data signal and various driving signals to the timing controller 120.

The timing controller 120 may output a gate timing control signal GDC for controlling the operation timing of the gate driver 130, a data timing control signal DDC for controlling the operation timing of the data driver 140, and various synchronization signals (vertical synchronization signal Vsync and horizontal synchronization signal Hsync). The timing controller 120 may supply a data signal DATA supplied from the image provider 110 along with the data timing control signal DDC to the data driver 140. The timing controller 120 may take the form of an integrated circuit (IC) and be mounted on a printed circuit board, but is not limited thereto.

The gate driver 130 may output a gate signal (or a gate voltage) in response to the gate timing control signal GDC supplied from the timing controller 120. The gate driver 130 may supply gate signals to sub-pixels included in the display panel 150 through gate lines GL1 to GLm. The gate driver 130 may be take the form of an IC or may be directly formed on the display panel 150 in a gate-in-panel structure, but is not limited thereto.

The data driver 140 may sample and latch the data signal DATA in response to the data timing control signal DDC supplied from the timing controller 120, convert the digital data signal into an analog data voltage based on a gamma reference voltage, and output the analog data voltage. The data driver 140 may supply a data voltage to the sub-pixels included in the display panel 150 through data lines DL1 to DLn. The data driver 140 may take form of an IC and be mounted on the display panel 150 or mounted on a printed circuit board, but is not limited thereto.

The power supply 180 may generate a high-level voltage and a low-level voltage based on an external input voltage supplied from the outside, and output the high-level voltage and the low-level voltage through a first power line EVDD and a second power line EVSS. The power supply 180 may generate and output voltages (e.g., gate voltages including a gate high voltage and a gate low voltage) necessary to drive the gate driver 130 and voltages (drain voltages including a drain voltage and a half drain voltage) necessary to drive the data driver 140 as well as the high-level voltage and the low-level voltage.

The display panel 150 may display an image in response to driving signals including a gate signal and a data voltage, driving voltages including the high-level voltage and the low-level voltage, and the like. The sub-pixels of the display panel 150 directly emit light. The display panel 150 may be manufactured based on a substrate having rigidity or flexibility, such as glass, silicon, polyimide, or the like. In addition, the sub-pixels that emit light may include red, green, and blue pixels or include red, green, blue, and white pixels.

For example, one sub-pixel SP may be connected to the first data line DL1, the first gate line GL1, the first power line EVDD, and the second power line EVSS and may include a pixel circuit including a switching transistor, a driving transistor, a capacitor, an organic light emitting diode, and the like. Since the sub-pixel SP used in the light emitting display device directly emits light, the circuit configuration is complicated. In addition, there are various compensation circuits for compensating for deterioration of a driving transistor for supplying a driving current necessary to drive organic light emitting diodes emitting light as well as the organic light emitting diodes. Accordingly, it is noted that the sub-pixel SP is simply illustrated in the form of a block.

Meanwhile, in the above description, the timing controller 120, the gate driver 130, the data driver 140, and the like are described as individual components. However, depending on the implementation method of the light emitting display device, one or more of the timing controller 120, the gate driver 130, and the data driver 140 may be integrated into one IC.

Figure 3:
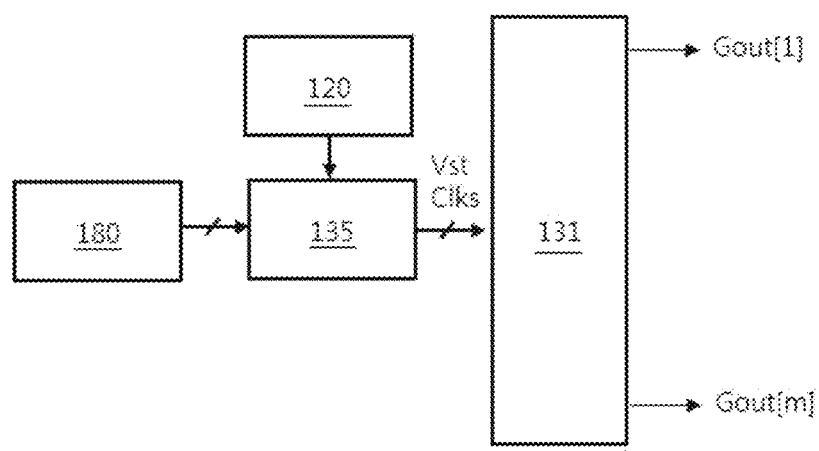
FIG. 3 and FIG. 4 are diagrams illustrating the configuration of a gate-in-panel type gate driver.
Figure 4:
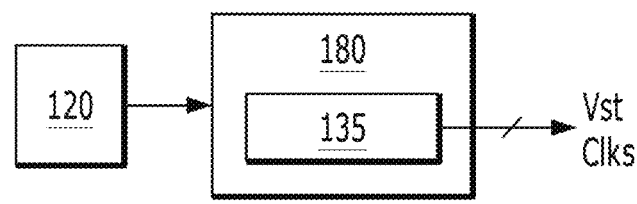
Figure 5:
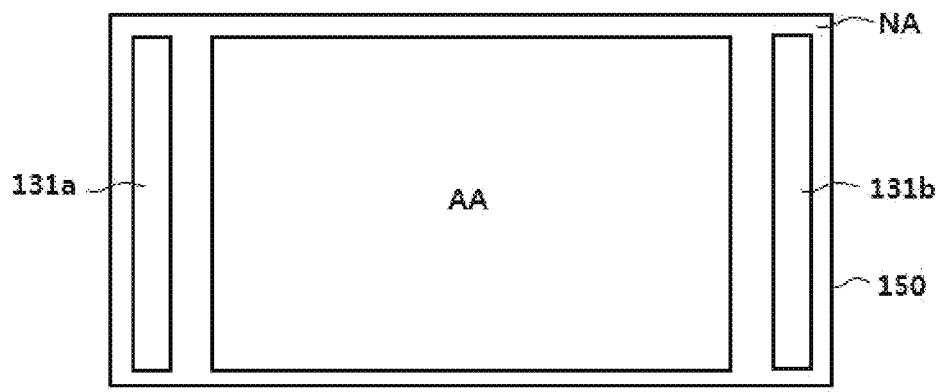
FIG. 5 is a diagram illustrating an arrangement example of the gate-in-panel type gate driver, according to an embodiment.

FIGS. 3 and 4 are diagrams illustrating a configuration of a gate-in-panel type gate driver, and FIG. 5 is a diagram showing an arrangement example of the gate-in-panel type gate driver, according to an embodiment.

As shown in FIG. 3, the gate-in-panel type gate driver 130 may include a shift register 131 and a level shifter 135. The level shifter 135 may generate clock signals Clks and a start signal Vst based on signals and voltages output from the timing controller 120 and the power supply 180. The clock signals Clks may be generated in the form of j different phases (j being an integer equal to or greater than 2).

As shown in FIGS. 3 and 4, unlike the shift register 131, the level shifter 135 may be independently configured as an IC or may be included in the power supply 180. However, this is merely an example and the present disclosure is not limited thereto.

As shown in FIG. 5, first and second shift registers 131a and 131b outputting gate signals in the gate-in-panel type gate driver may be disposed in a non-display area NA of the display panel 150. The first and second shift registers 131a and 131b may be formed as a thin film on the display panel 150 in a gate-in-panel structure. Although an example in which the first and second shift registers 131a and 131b are disposed in the left and right non-display areas NA of the display panel 150 is illustrated, the present disclosure is not limited thereto.

Figure 6:
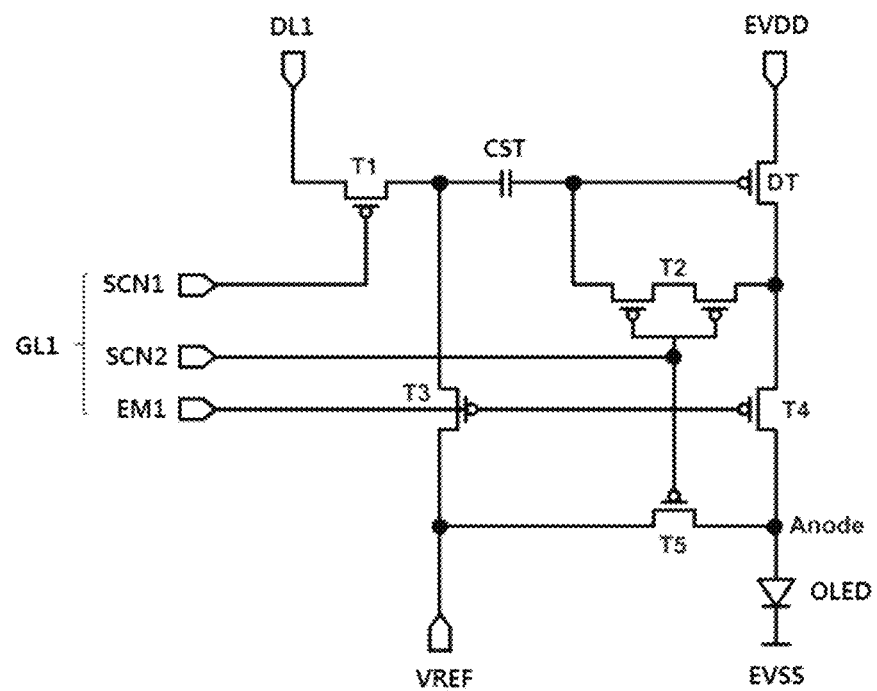
FIG. 6 is a circuit configuration diagram of a sub-pixel applicable to an embodiment of the present disclosure.
Figure 7:
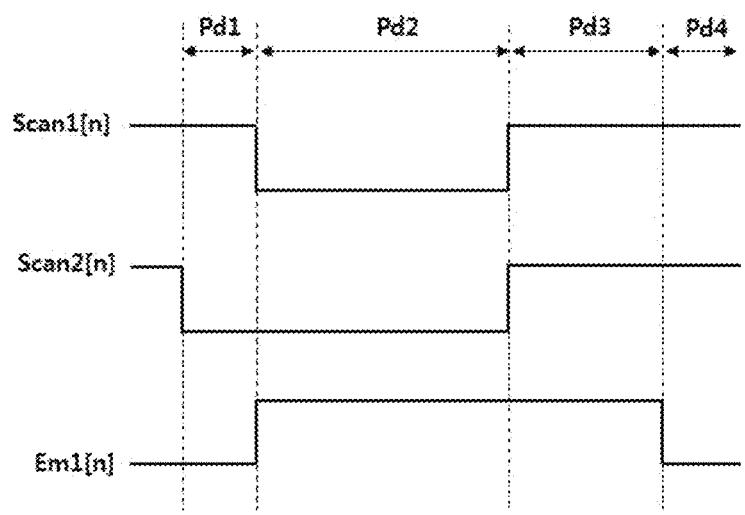
FIG. 7 is a driving waveform diagram of the sub-pixel shown in FIG. 6, and FIGS. 8 to 11 show operation states of a device for each period according to driving waveforms shown in FIG. 7, according to an embodiment.

FIG. 6 is a circuit configuration diagram of a sub-pixel applicable to an embodiment of the present disclosure, FIG. 7 is a driving waveform diagram of the sub-pixel shown in FIG. 6, and FIGS. 8 to 11 show operation states of a device for each period according to driving waveforms shown in FIG. 7, according to an embodiment.

As shown in FIGS. 6 and 7, the sub-pixel applicable to the embodiment of the present disclosure may include a first transistor T1, a second transistor T2, a third transistor T3, a fourth transistor 14, a fifth transistor T5, a driving transistor DT, a capacitor CST, and an organic light emitting diode OLED. The first transistor T1, the second transistor T2, the third transistor T3, the fourth transistor T4, the fifth transistor T5, and the driving transistor DT may be p-type transistors.

The first transistor T1 may have a gate electrode connected to a first scan signal line SCN1, a first electrode connected to the first data line DL1, and a second electrode connected to a first electrode of the capacitor CST. The first transistor T1 may be turned on during a second period P2 in response to a first scan signal Scan1[n] applied through the first scan signal line SCN1. When the first transistor T1 is turned on, a data voltage applied through the first data line DL1 may be transmitted to the first electrode of the capacitor CST.

The second transistor T2 may have a gate electrode connected to a second scan signal line SCN2, a first electrode connected to a gate electrode of the driving transistor DT and the second electrode of the capacitor CST, and a second electrode connected to a second electrode of the driving transistor DT and a first electrode of the fourth transistor 14. The second transistor T2 may be turned on during a first period P1 and the second period P2 in response to a second scan signal Scan2[n] applied through the second scan signal line SCN2. When the second transistor T2 is turned on, the gate electrode and the second electrode of the driving transistor DT are connected, and thus the threshold voltage of the driving transistor DT can be sampled (threshold voltage compensation). Although the second transistor T2 may be formed of two transistors (a double-gate transistor) as illustrated in order to minimize leakage current, but is not limited thereto.

The third transistor T3 may have a gate electrode connected to a first light emission signal line EM1, a first electrode connected to a reference voltage line VREF, and a second electrode connected to the second electrode of the first transistor T1 and the first electrode of the capacitor CST. The third transistor T3 may be turned on during the first period P1 and a fourth period P4 in response to a first light emission signal Em1[n] applied through the first light emission signal line EM1. When the third transistor T3 is turned on, a voltage (such as an initialization voltage) applied through the reference voltage line VREF may be transmitted to the first electrode of the capacitor CST.

The fourth transistor T4 may have a gate electrode connected to the first light emission signal line EM1, a first electrode connected to the second electrode of the driving transistor DT, and a second electrode connected to the anode of the organic light emitting diode OLED. The fourth transistor T4 may be turned on during the first period P1 and the fourth period P4 in response to the first light emission signal Em1[n] applied through the first light emission signal line EM1. When the fourth transistor T4 is turned on, driving current generated from the driving transistor DT may be transferred to the anode of the organic light emitting diode OLED.

The fifth transistor T5 may have a gate electrode connected to the second scan signal line SCN2, a first electrode connected to the reference voltage line VREF, and a second electrode connected to the second electrode of the fourth transistor T4 and the anode of the organic light emitting diode OLED. The fifth transistor T5 may be turned on during the first period P1 and the second period P2 in response to the second scan signal Scan2[n] applied through the second scan signal line SCN2. When the fifth transistor T5 is turned on, the voltage (such as the initialization voltage) applied through the reference voltage line VREF may be transmitted to the anode of the organic light emitting diode OLED.

The driving transistor DT may include a gate electrode connected to the second electrode of the capacitor CST, a first electrode connected to the first power line EVDD, and a second electrode connected to the second electrode of the second transistor T2 and the first electrode of the fourth transistor T4. The driving transistor DT may generate a driving current during the fourth period P4 in response to a data voltage stored in the capacitor CST.

The organic light emitting diode OLED includes the anode connected to the second electrode of the fourth transistor T4 and the second electrode of the fifth transistor T5, and the cathode connected to the second power line EVSS. The organic light emitting diode OLED may emit light during the fourth period P4 in response to the driving current transmitted through the turned on fourth transistor T4.

Figure 8:
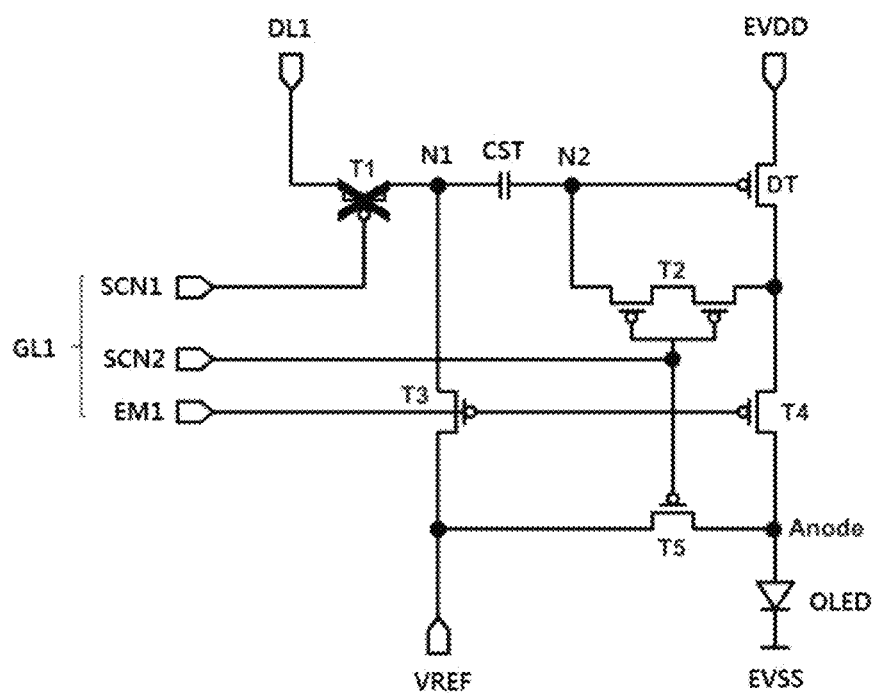
Figure 9:
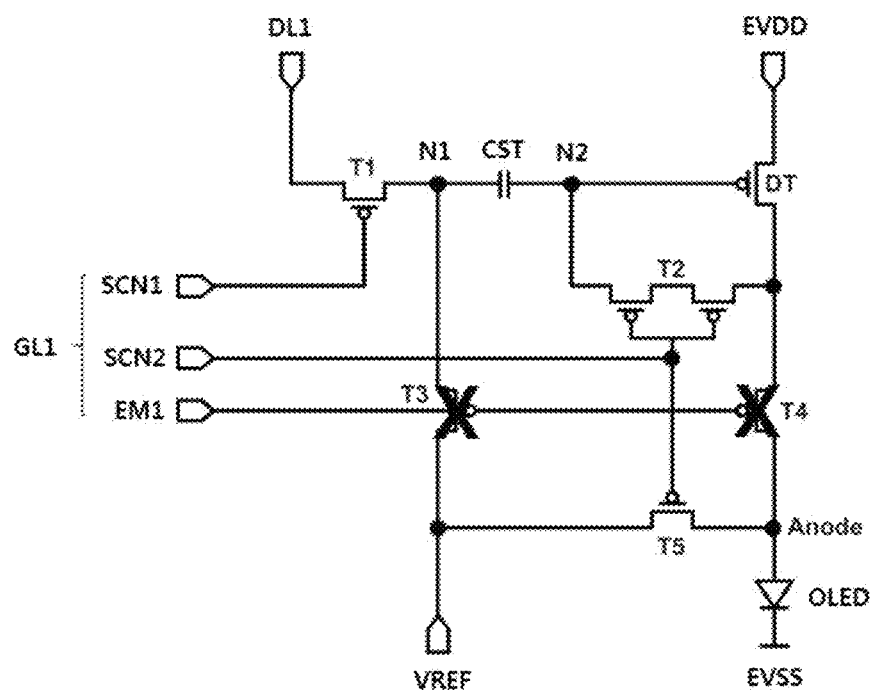
Figure 10:
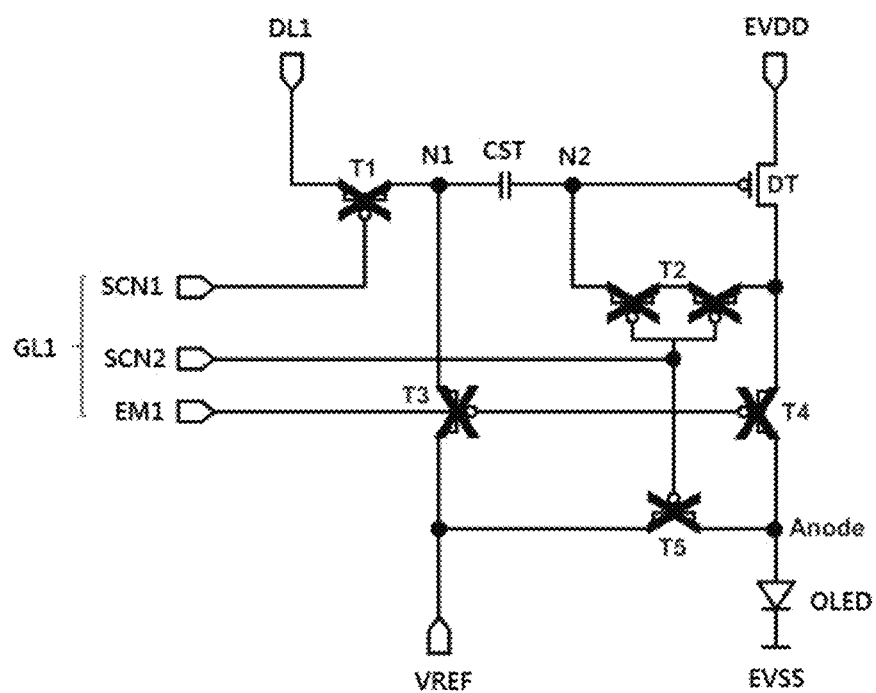
Figure 11:
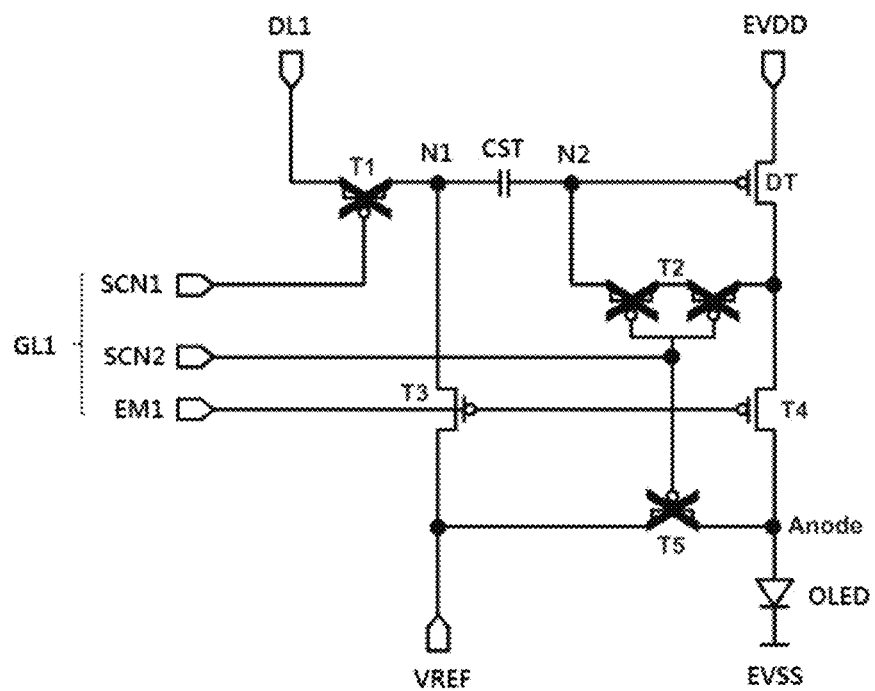

The first period P1 shown in FIG. 8 may be defined as an initialization period. The second period P2 shown in FIG. 9 may be defined as a data writing and sampling period. The third period P3 shown in FIG. 10 may be defined as a hold period. The fourth section P4 shown in FIG. 11 may be defined as an emission period. The overall flow in the sub-pixel according to the operating state of the device in each period according to driving waveforms may be as illustrated in FIGS. 6 and 7, but this is merely an example.

Figure 12:
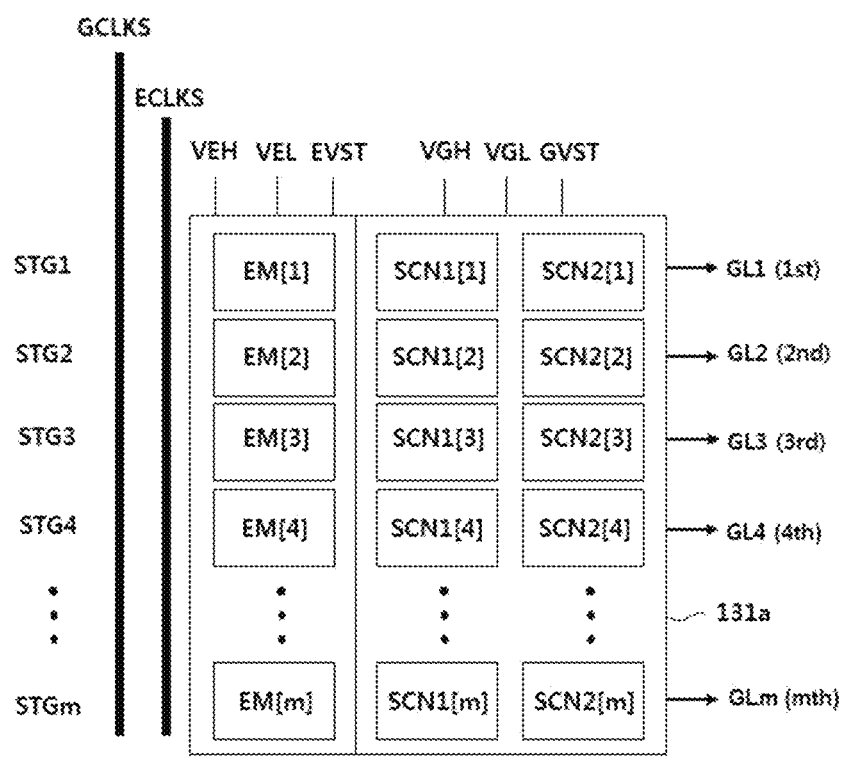
FIG. 12 is a block diagram of a first shift register according to an experimental example.
Figure 13:
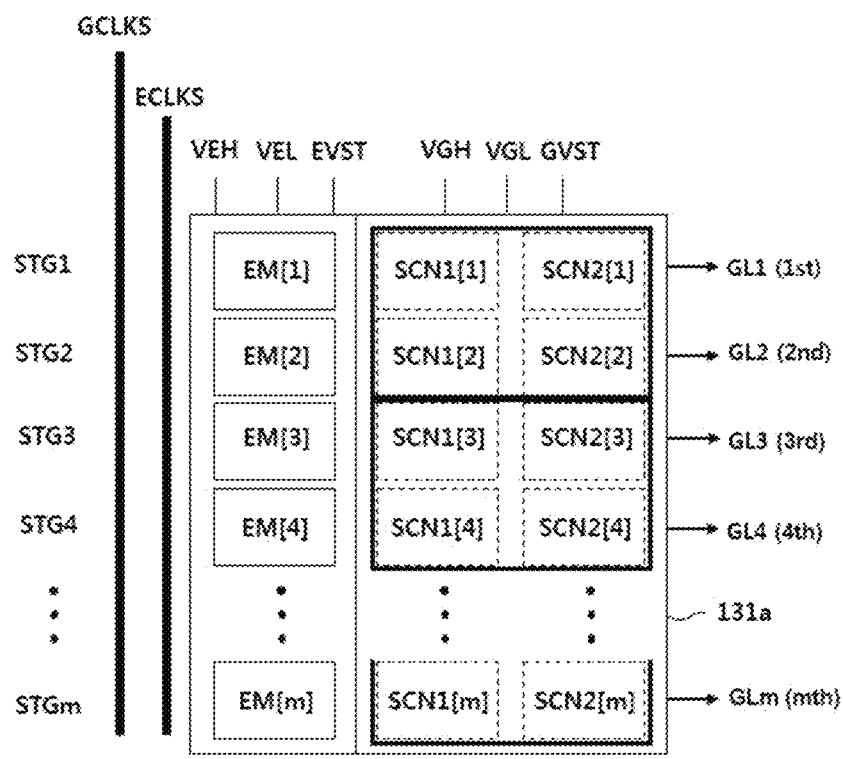
FIG. 13 is a block diagram of a first shift register according to an embodiment.

FIG. 12 is a block diagram of the first shift register according to an experimental example, and FIG. 13 is a block diagram of the first shift register according to an embodiment.

As shown in FIG. 12, the first shift register 131a according to the experimental example may include first scan signal generators SCN1[1] to SCN1[m], second scan signal generators SCN2[1] to SCN2[m], and light emission signal generators EM[1] to EM[m]. The first shift register according to the experimental example may generate gate signals GL1 to GLm including the scan signals and the emission signal as shown in FIG. 7 to drive the sub-pixel shown in FIG. 6.

The first scan signal generators SCN1[1] to SCN1[m] and the second scan signal generators SCN2[1] to SCN2[m] may operate based on signals and voltages applied through first clock signal lines GCLKS, a first start signal line GVST, a first gate high voltage line VGH, and a first gate low voltage line VGL. Clock signals applied through the first clock signal lines GCLKS may have at least 10 phases.

The light emission signal generators EM[1] to EM[m] may operate based on signals and voltages applied through second clock signal lines ECLKS, a second start signal line EVST, a second gate high voltage line VEH, and a second gate low voltage line VEL. Clock signals applied through the second clock signal lines ECLKS may have at least two phases.

As shown in FIG. 13, the first shift register 131a according to the embodiment may include first scan signal generators SCN1[1] to SCN1[m], second scan signal generators SCN2[1] to SCN2[m], and light emission signal generators EM[1] to EM[m]. The first shift register according to the embodiment may generate the gate signals GL1 to GLm including the scan signals and the light emission signal as shown in FIG. 7 to drive the sub-pixel shown in FIG. 6.

The first scan signal generators SCN1[1] to SCN1[m] and the second scan signal generators SCN2[1] to SCN2[m] may operate based on signals and voltages applied through the first clock signal lines GCLKS, the first start signal line GVST, the first gate high voltage line VGH, and the first gate low voltage line VGL.

The light emission signal generators EM[1] to EM[m] may operate based on signals and voltages applied through the second clock signal lines ECLKS, the second start signal line EVST, the second gate high voltage line VEH, and the second gate low voltage line VEL.

As shown in FIGS. 12 and 13, the first scan signal generator SCN1[1], the second scan signal generator SCN2[1], and the first light emission signal generator EM[1] may be included in a first stage STG1. The first gate signals including the first scan signal, the second scan signal, and the first light emission signal output from the first stage STG1 may be transmitted through first scan signal line, the second scan signal line, and the first light emission signal line included in the first gate line GL1 positioned on the first horizontal line 1st. This can be ascertained from FIGS. 6 and 7.

Hereinafter, circuits included in second to M-th stages STG2 to STGm may be configured in the same manner as the first stage STG1 except that they are respectively connected to the second horizontal line 2nd to the M-th horizontal line mth and output signals thereto.

In the embodiment, unlike the experimental example, a total of four scan signal generators included in two stages (e.g., STG1 and STG2), for example, neighboring first scan signal generators (e.g., SCN1[1] and SCN1[2]) and neighboring second scan signal generators (e.g., SCN2[1] and SCN2[2]) can be grouped and integrated to form a single integrated scan signal generation circuit.

The aforementioned method of grouping and integrating a total of four scan signal generators adjacent in the vertical and horizontal directions to form a single integrated scan signal generation circuit can be equally applied to stages (not shown) of the second shift register as well as the stages STG1 to STGm of the first shift register 131a, and description thereof will be provided below.

Figure 14:
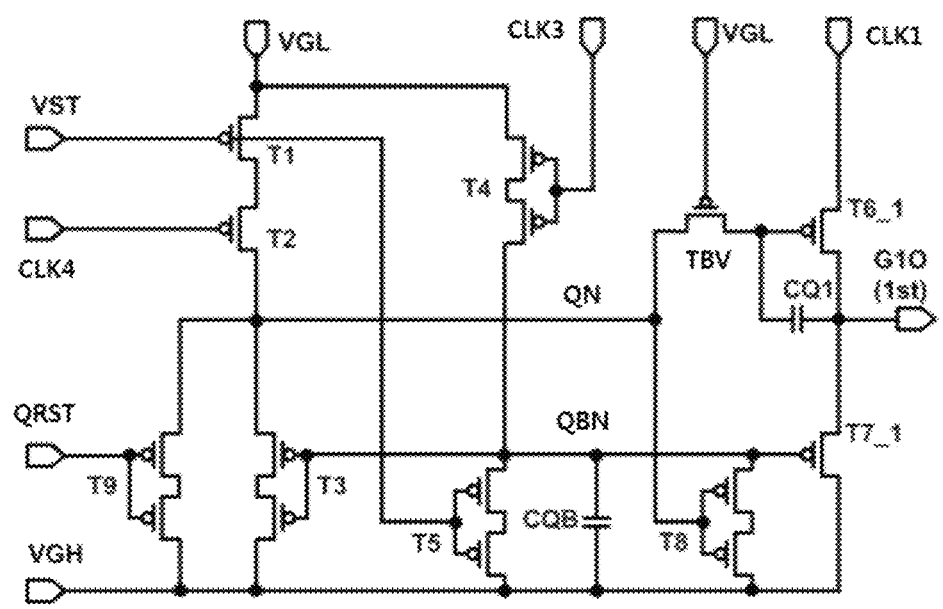
FIG. 14 is a circuit configuration diagram of a scan signal generator applicable to an embodiment of the present disclosure.
Figure 15:
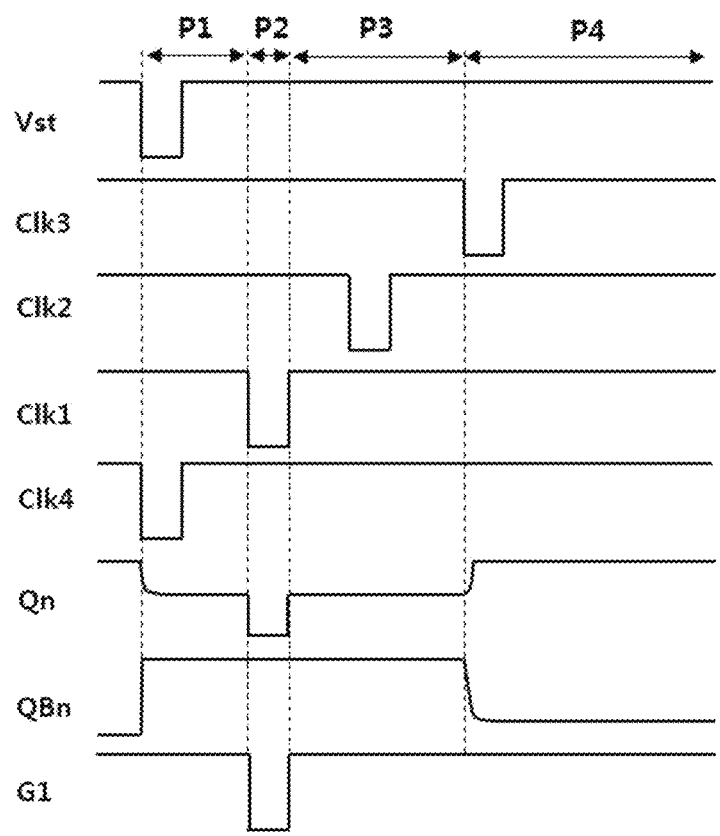
FIG. 15 is a driving waveform diagram of the scan signal generator shown in FIG. 14, and FIGS. 16 to 20 show operation states of the scan signal generator for each period in FIG. 15, according to an embodiment.

FIG. 14 is a circuit configuration diagram of a scan signal generator applicable to an embodiment of the present disclosure, FIG. 15 is a driving waveform diagram of the scan signal generator shown in FIG. 14, and FIGS. 16 to 20 show operation states of the scan signal generator for each period of FIG. 15.

As shown in FIG. 14, the scan signal generator applicable to the embodiment may be connected to the start signal line VST, the gate low voltage line VGL, the gate high voltage line VGH, a first clock signal line CLK1, a third clock signal line CLK3, a fourth clock signal line CLK4, and a reset signal line QRST.

The scan signal generator applicable to the embodiment may include a first transistor T1, a second transistor T2, a third transistor T3, a fourth transistor T4, a fifth transistor T5, a stabilization transistor TBV, a sixth transistor T6_1, a seventh transistor T7_1, an eighth transistor T8, a ninth transistor T9, an output capacitor CQ1, and a node capacitor CQB.

For example, the first transistor T1, the second transistor T2, the third transistor T3, the fourth transistor T4, the fifth transistor T5, the stabilization transistor TBV, the sixth transistor T6_1, the seventh transistor T7_1, the eighth transistor T8, and the ninth transistor T9 may be p-type transistors.

In addition, the third transistor T3, the fourth transistor T4, the fifth transistor T5, the eighth transistor T8, and the ninth transistor T9 may be formed of two transistors (a double-gate transistor) in order to minimize or reduce generation of leakage current, but the present disclosure is not limited thereto.

The first transistor T1 may have a gate electrode connected to the start signal line VST and a first electrode connected to the gate low voltage line VGL. The second transistor T2 may have a gate electrode connected to the fourth clock signal line CLK4, a first electrode connected to the second electrode of the first transistor T1, and a second electrode connected to a QN node QN. The third transistor T3 may have a gate electrode connected to a QB node QBN (an inverting node operating opposite to the QN node), a first electrode connected to the gate high voltage line VGH, and a second electrode connected to the QN node QN.

The fourth transistor T4 may have a gate electrode connected to the third clock signal line CLK3, a first electrode connected to the gate low voltage line VGL, and a second electrode connected to the QB node QBN. The fifth transistor T5 may have a gate electrode connected to the start signal line VST, a first electrode connected to the gate high voltage line VGH, and a second electrode connected to the QB node QBN. The stabilization transistor TBV may have a gate electrode connected to the gate low voltage line VGL, a first electrode connected to the QN node QN, and a second electrode connected to the gate electrode of the sixth transistor T6_1.

The sixth transistor T6_1 may have a gate electrode connected to the second electrode of the stabilization transistor TBV, a first electrode connected to the first clock signal line CLK1, and a second electrode connected to an output terminal G10. The seventh transistor T7_1 may have a gate electrode connected to the QB node QBN, a first electrode connected to the gate high voltage line VGH, and a second electrode connected to the output terminal G10. The eighth transistor T8 may have a gate electrode connected to the QN node QN, a first electrode connected to the gate high voltage line VGH, and a second electrode connected to the QB node QBN.

As described herein, in one embodiment referred throughout the specification, various signals are described with respect to transitioning from a first state (e.g., high logic state) to a second state (e.g., low logic state). However, it is appreciated that in other embodiments, the logic states are not limited hereto and may differ depending on the types of switches or transistors that are used to configure the scan signal generator and pixel circuits. For example, when the transistors are n-type transistors, the signals for turning on the transistors may transition from a first state (e.g., low logic state) to a second state (e.g., high logic state).

The ninth transistor T9 may have a gate electrode connected to the reset signal line QRST, a first electrode connected to the gate high voltage line VGH, and a second electrode connected to the QN node QN. The output capacitor CQ1 may have a first electrode connected to the gate electrode of the sixth transistor T6_1 and a second electrode of the stabilization transistor TBV, and a second electrode connected to the output terminal G10. The node capacitor CQB may have a first electrode connected to the gate high voltage line VGH and a second electrode connected to the QB node QBN.

Figure 16:
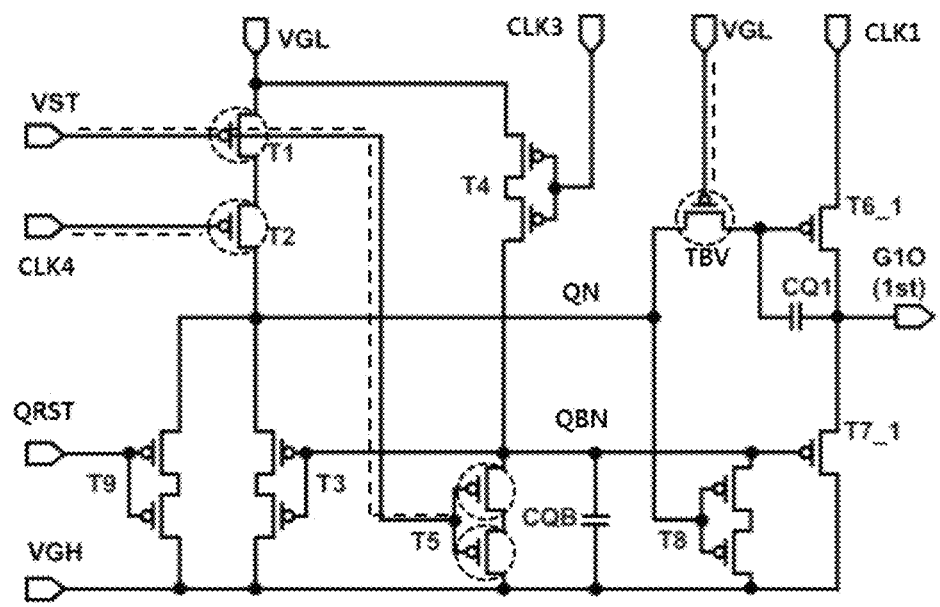

In the first period P1 shown in FIGS. 15 and 16, the first transistor T1 can be turned on in response to the start signal Vst at a low voltage (e.g., second logic state) applied through the start signal line VST. The fifth transistor T5 can be turned on in response to the start signal Vst at the low voltage (e.g., second logic state) applied through the start signal line VST. The second transistor T2 can be turned on in response to a fourth clock signal at a low voltage applied through the fourth clock signal line CLK4. The stabilization transistor TBV can be turned on in response to a gate low voltage at a low voltage applied through the gate low voltage line VGL.

Figure 17:
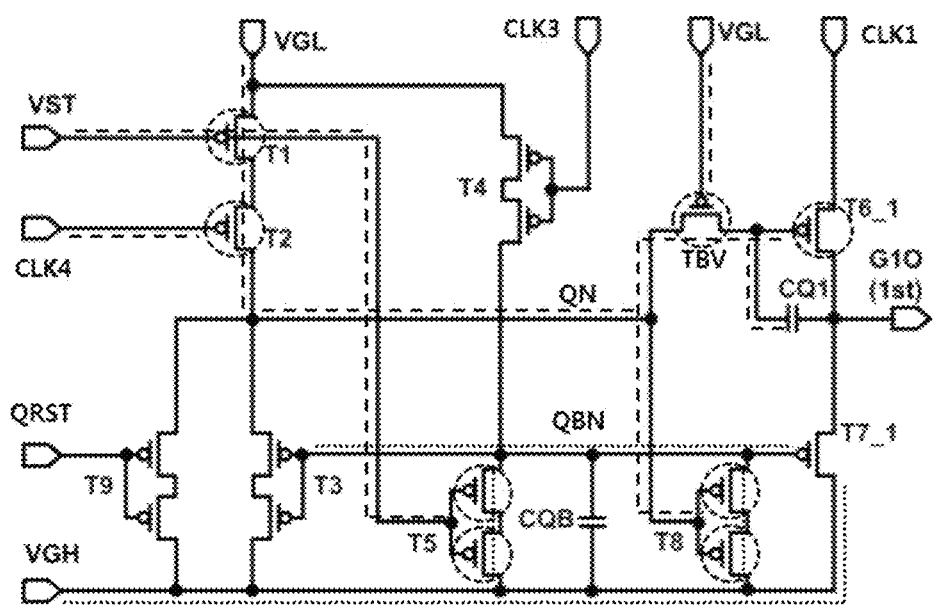

In the first period P1 shown in FIGS. 15 and 17, the QN node QN can be charged with the gate low voltage according to the turn-on operation of the first transistor T1 and the second transistor T2, and the sixth transistor T6_1 can be turned on by the gate low voltage transmitted through the stabilization transistor TBV. The QBN node QBN can be charged with the gate high voltage according to the turn-on operation of the fifth transistor T5 and the eighth transistor T8, and the seventh transistor T7_1 can be turned off by the gate high voltage. During the first period P1, the QN node QN may be charged with the voltage corresponding to the sum of the gate low voltage and the threshold voltage of the transistors.

Figure 18:
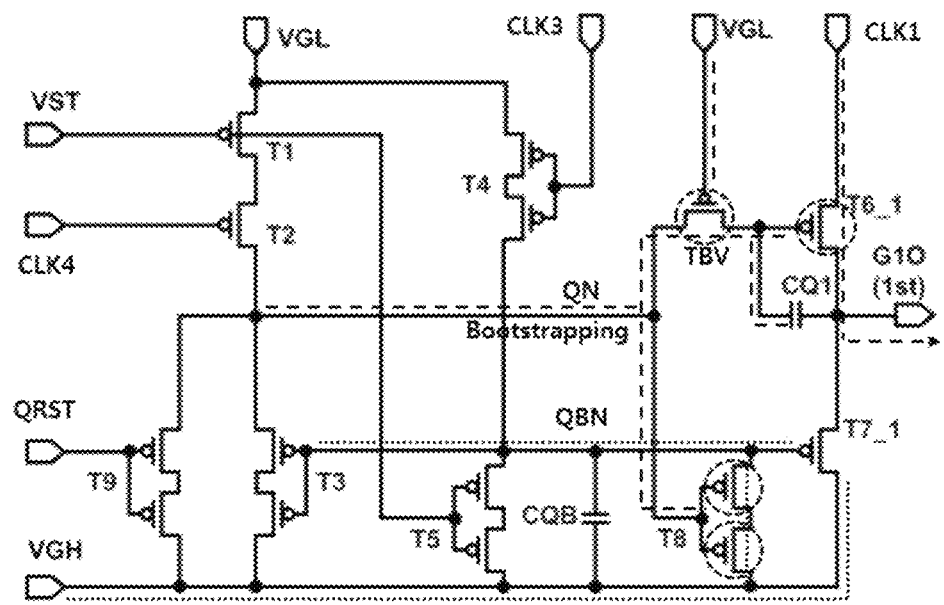

In the second period P2 shown in FIGS. 15 and 18, as the first transistor T1, the second transistor T2, and the fifth transistor T1 are turned on, the QN node QN can enter a floating state. However, as the first clock signal Clk1 applied through the first clock signal line CLK1 changes to a low voltage, bootstrapping caused by the output capacitor CQ1 may occur in the QN node QN. Accordingly, the voltage Qn of the QN node QN may be lowered to the level of the gate low voltage (e.g., third logic state lower than a second logics state). In addition, the low voltage of the first clock signal Clk1 can be output through the output terminal G10 via the turned on sixth transistor T6_1. In this case, the low voltage of the first clock signal Clk1 output through the output terminal G10 may be used as the first scan signal G1 capable of turning on the transistors included in the sub-pixel.

Figure 19:
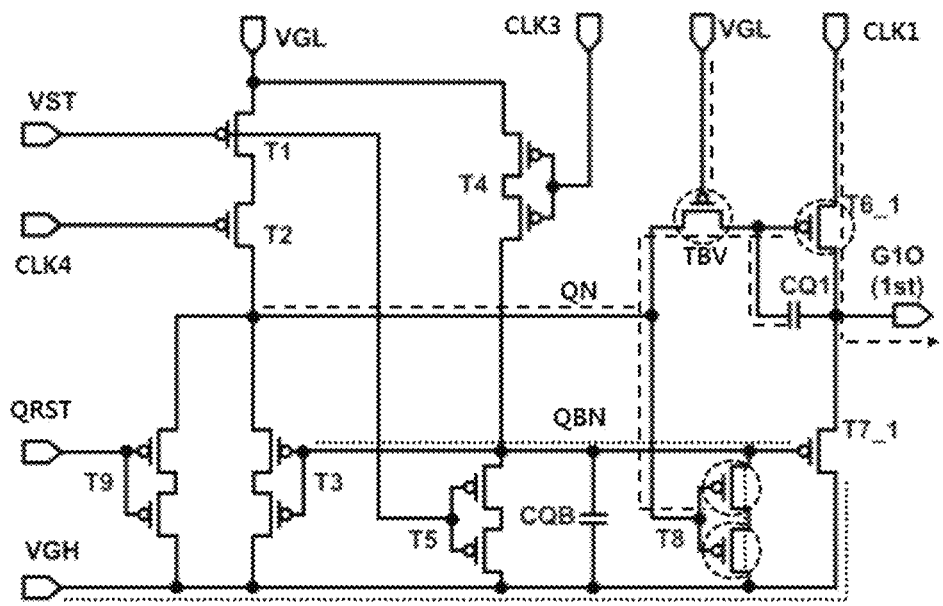

In the third period P3 shown in FIGS. 15 and 19, the sixth transistor T6_1 may still be turned on by the low voltage charged in the QN node QN. However, the first clock signal Clk1 applied through the first clock signal line CLK1 may be in a state of being changed from the low voltage to a high voltage. Accordingly, the high voltage of the first clock signal Clk1 may be output through the output terminal G10 via the turned on sixth transistor T6_1.

Figure 20:
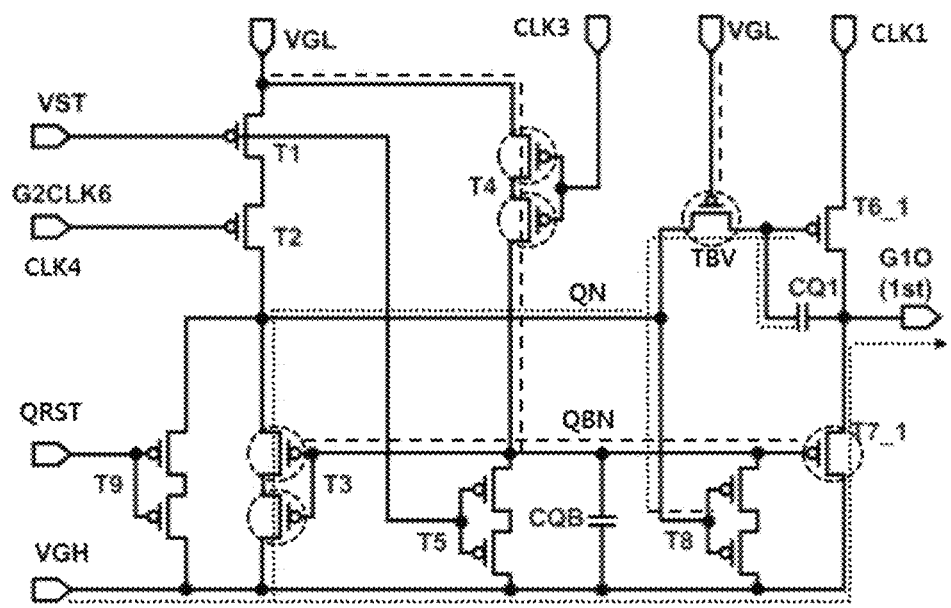

In the fourth period P4 shown in FIGS. 15 and 20, the fourth transistor 14 can be turned on by the third clock signal Clk3 at a logic voltage applied through the third clock signal line CLK3. The QBN node QBN can be charged with the gate low voltage by the gate low voltage transferred through the fourth transistor T4. The third transistor T3 can be turned on by the gate low voltage charged in the QBN node QBN, and the QN node QN can be charged with the gate high voltage applied through the gate high voltage line VGH through the turned on third transistor T3. Accordingly, the sixth transistor T6_1 can be turned off. In contrast, the seventh transistor T7_1 can be turned on by the gate low voltage charged in the QBN node QBN, and the gate high voltage applied through the gate high voltage line VGH can be output through the output terminal G10 via the turned on seventh transistor T7_1.

Figure 21:
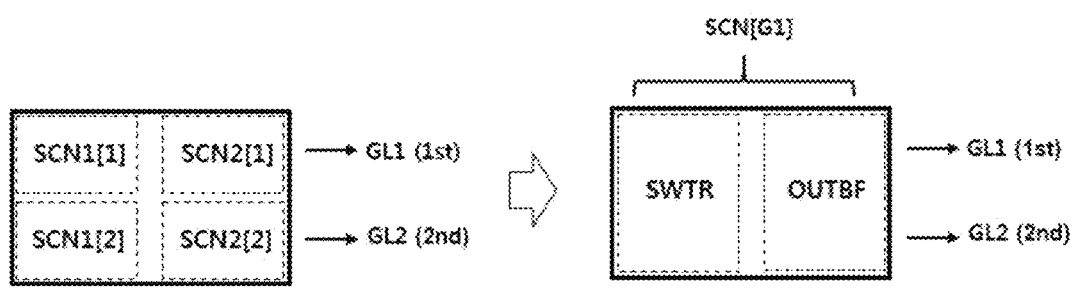
FIG. 21 is a diagram illustrating the concept of an integrated block of a shift register according to an embodiment of the present disclosure.
Figure 22:
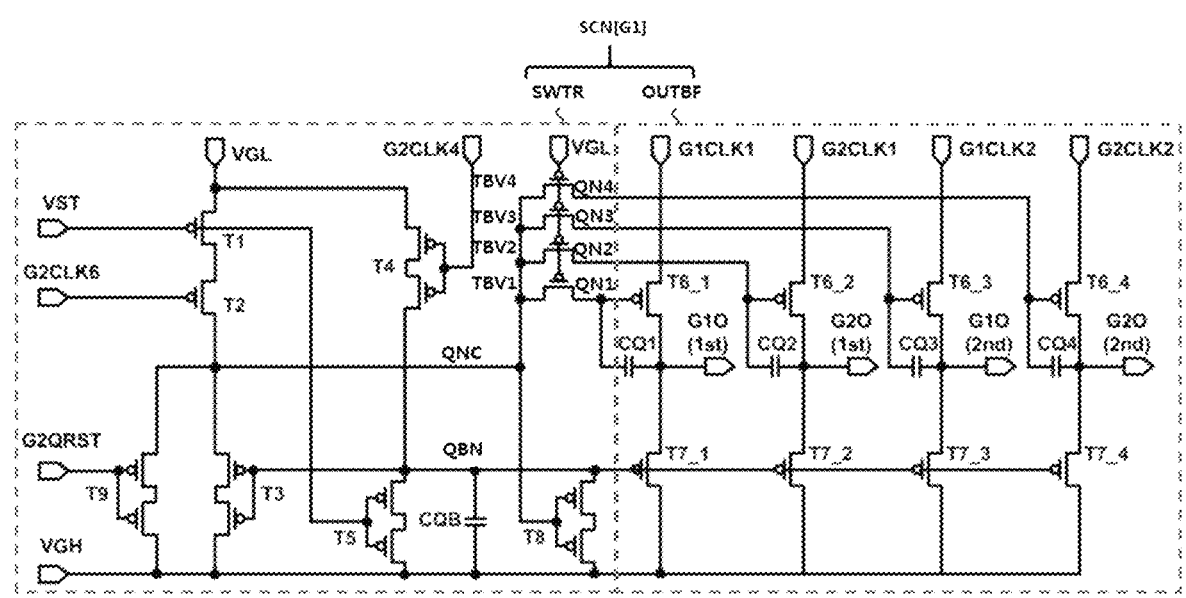
FIG. 22 is an internal circuit configuration diagram of an integrated scan signal generation circuit shown in FIG. 21.
Figure 23:
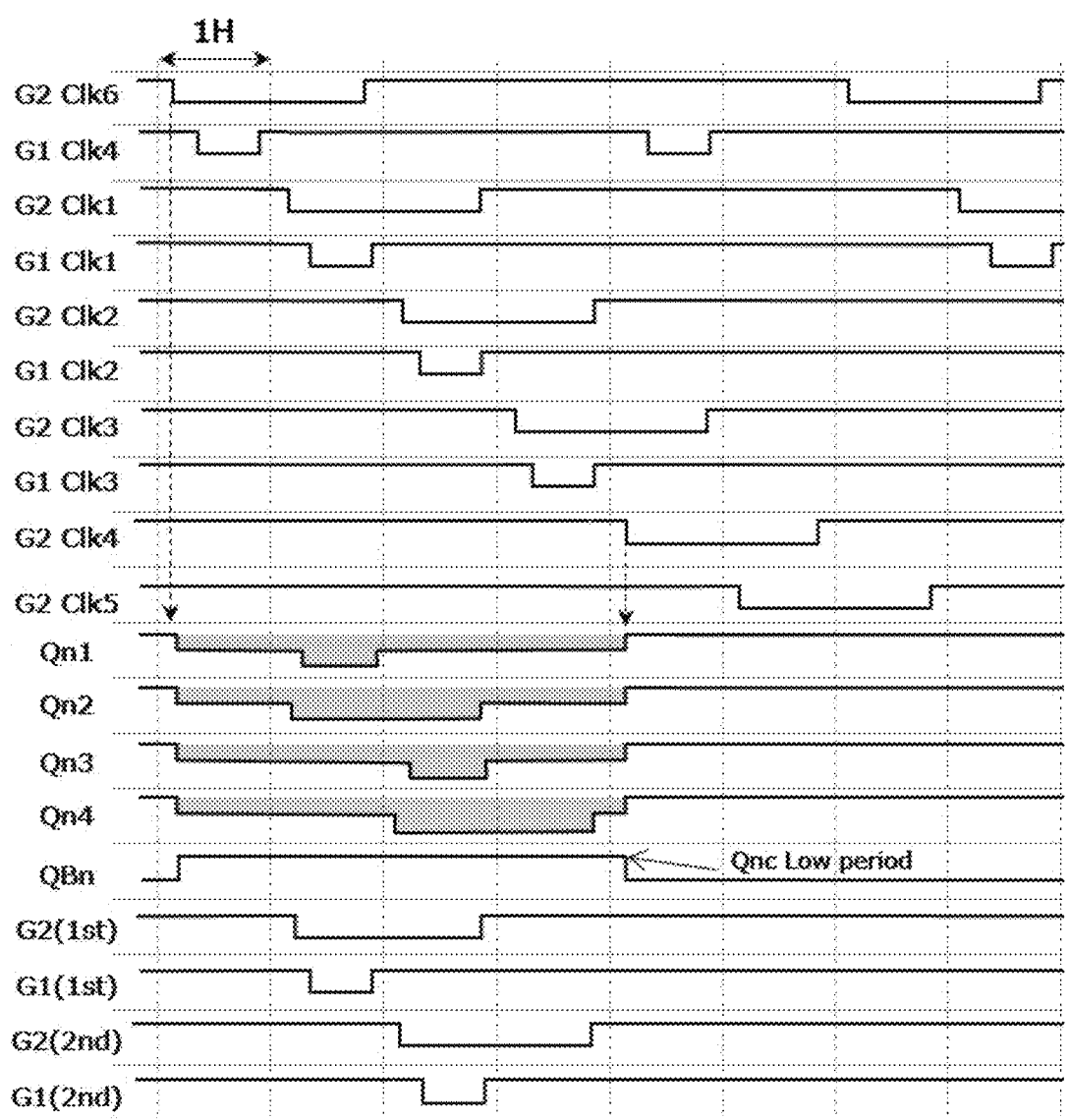
FIG. 23 is a driving waveform diagram of the circuit shown in FIG. 22, according to an embodiment.

FIG. 21 is a diagram illustrating the concept of an integrated block of a shift register according to an embodiment of the present disclosure, FIG. 22 is an internal circuit configuration diagram of the integrated scan signal generation circuit shown in FIG. 21, and FIG. 23 is a driving waveform diagram of the circuit shown in FIG. 22, according to an embodiment.

As shown in FIG. 21, in the embodiment of the present disclosure, the first scan signal generators (e.g., SCN1[1] and SCN1[2]) and the second scan signal generators (e.g., SCN2[1] and SCN2[2]) that generate scan signals to be supplied to the first gate line GL1 positioned on the first horizontal line 1st and the second gate line GL2 positioned on the second horizontal line 2nd may be grouped and integrated to form a single integrated scan signal generation circuit SCN[G1].

The integrated scan signal generation circuit SCN[G1] can generate scan signals to be supplied to the first gate line GL1 positioned on the first line 1st and the second gate line GL2 positioned on the second line 2nd, as before integration. However, since a total of four signal generators are integrated, the circuit configuration is divided into a switch circuit SWTR for controlling nodes and an output circuit OUTBF for outputting a signal. This will be described below. Here, the following description is based on the scan signal generators shown in FIG. 14 to aid in understanding of the description.

As shown in FIG. 22, the integrated scan signal generation circuit SCN[G1] according to the embodiment may include the switch circuit SWTR for controlling nodes and the output circuit OUTBF for outputting a signal.

The switch circuit SWTR may include a first transistor T1, a second transistor T2, a third transistor T3, a fourth transistor T4, a fifth transistor T5, a first stabilization transistor TBV1, a second stabilization transistor TBV2, a third stabilization transistor TBV3, a fourth stabilization transistor TBV4, an eighth transistor T8, a ninth transistor T9, and a node capacitor CQB.

The third transistor T3, the fourth transistor T4, the fifth transistor T5, the eighth transistor T8, and the ninth transistor T9 may be composed of two transistors (a double-gate transistor) in order to minimize or reduce generation of leakage current, but the present disclosure is not limited thereto.

The first transistor T1 may have a gate electrode connected to a start signal line VST and a first electrode connected to a gate low voltage line VGL. The second transistor T2 may have a gate electrode connected to a (2-6)th clock signal line G2CLK6, a first electrode connected to a second electrode of the first transistor T1, and a second electrode connected to a common QN node QNC. The third transistor T3 may have a gate electrode connected to a QB node QBN, a first electrode connected to a gate high voltage line VGH, and a second electrode connected to the common QN node QNC. The (2-6)th clock signal line G2CLK6 may be defined as a common node clock signal line because a clock signal for controlling the common QN node QNC is applied thereto.

The fourth transistor T4 may have a gate electrode connected to a (2-4)th clock signal line G2CLK4, a first electrode connected to the gate low voltage line VGL, and a second electrode connected to the QB node QBN. The fifth transistor T5 may have a gate electrode connected to the start signal line VST, a first electrode connected to the gate high voltage line VGH, and a second electrode connected to the QB node QBN. The (2-4)th clock signal line G2CLK4 may be defined as an inverted node clock signal line because a clock signal for controlling the QB node QBN is applied thereto.

The first stabilization transistor TBV1 may have a gate electrode connected to the gate low voltage line VGL, a first electrode connected to the common QN node QNC, and a second electrode connected to a first QN node QN1. The second stabilization transistor TBV2 may have a gate electrode connected to the gate low voltage line VGL, a first electrode connected to the common QN node QNC, and a second electrode connected to a second QN node QN2. The third stabilization transistor TBV3 may have a gate electrode connected to the gate low voltage line VGL, a first electrode connected to the common QN node QNC, and a second electrode connected to a third QN node QN3. The fourth stabilization transistor TBV4 may have a gate electrode connected to the gate low voltage line VGL, a first electrode connected to the common QN node QNC, and a second electrode connected to a fourth QN node QN4.

The eighth transistor T8 may have a gate electrode connected to the common QN node QNC, a first electrode connected to the gate high voltage line VGH, and a second electrode connected to the QB node QBN. The ninth transistor T9 may have a gate electrode connected to a second reset signal line G2QRST, a first electrode connected to the gate high voltage line VGH, and a second electrode connected to the common QN node QNC. The node capacitor CQB may have a first electrode connected to the gate high voltage line VGH and a second electrode connected to the QB node QBN.

The output circuit OUTBF may include a (6-1)th transistor T6_1, a (6-2)th transistor T6_2, a (6-3)th transistor T6_3, a (6-4)th transistor T6_4, a (7-1)th transistor T7_1, a (7-2)th transistor T7_2, a (7-3)th transistor T7_3, a (7-4)th transistor T7_4, a (1-1)th output capacitor CQ1, a (1-2)th output capacitor CQ2, a (2-1)th output capacitor CQ3, and a (2-2)th output capacitor CQ4. The (6-1)th transistor T6_1, the (6-2)th transistor T6_2, the (6-3)th transistor T6_3, and the (6-4)th transistor T6_4 may be respectively defined as a (1-1)th pull-up transistor, a (1-2)th pull-up transistor, a (2-1)th pull-up transistor, and a (2-2)th pull-up transistor. In addition, the (7-1)th transistor T7_1, the (7-2)th transistor T7_2, the (7-3)th transistor T7_3, and the (7-4)th transistor T7_4 may be respectively defined as a (1-1)th pull-down transistor, a (1-2)th pull-down transistor, a (2-1)th pull-down transistor, and a (2-2)th pull-down transistor.

The (6-1)th transistor T6_1 may have a gate electrode connected to the first QN node QN1 that is a second electrode of the first stabilization transistor TBV1, a first electrode connected to a (1-1)th clock signal line G1CLK1, and a second electrode connected to a (1-1)th output terminal G10(1st). The (7-1)th transistor T7_1 may have a gate electrode connected to the QB node QBN, a first electrode connected to the gate high voltage line VGH, and a second electrode connected to the (1-1)th output terminal G10 (1st). The first output capacitor CQ1 may have a first electrode connected to the gate electrode of the (6-1)th transistor T6_1 and the first QN node QN1 that is the second electrode of the first stabilization transistor TBV1, and a second electrode connected to the (1-1)th output terminal G10(1st).

The (6-2)th transistor T6_2 may have a gate electrode connected to the second QN node QN2, which is the second electrode of the second stabilization transistor TBV2, a first electrode connected to a (1-2)th clock signal line G2CLK1, and a second electrode connected to a (1-2)th output terminal G20(1st). The (7-2)th transistor T7_2 may have a gate electrode connected to the QB node QBN, a first electrode connected to the gate high voltage line VGH, and a second electrode connected to the (1-2)th output terminal G20 (1st). The second output capacitor CQ2 may have a first electrode connected to the gate electrode of the (6-2)th transistor T6_2 and the second QN node QN2 which is the second electrode of the second stabilization transistor TBV2, and a second electrode connected to the (1-2)th output terminal G20(1st).

The (6-3)th transistor T6_3 may have a gate electrode connected to the 3rd QN node QN3 which is the second electrode of the third stabilization transistor TBV3, a first electrode connected to a (2-1)th clock signal line G1CLK2, and a second electrode connected to the (2-1)th output terminal G10(2nd). The (7-3)th transistor T7_3 may have a gate electrode connected to the QB node QBN, a first electrode connected to the gate high voltage line VGH, and a second electrode connected to the (2-1)th output terminal G10(2nd). The third output capacitor CQ3 may have a first electrode connected to the gate electrode of the (6-3)th transistor T6_3 and the third QN node QN3 which is the second electrode of the third stabilization transistor TBV3, and a second electrode connected to the (2-1)th output terminal G10(2nd).

The (6-4)th transistor T6_4 may have a gate electrode connected to the fourth QN node QN4 that is a second electrode of the fourth stabilization transistor TBV4, a first electrode connected to a (2-2)th clock signal line G2CLK2, and a second electrode connected to a (2-2)th output terminal G20(2nd). The (7-4)th transistor T7_4 may have a gate electrode connected to the QB node QBN, a first electrode connected to the gate high voltage line VGH, and a second electrode connected to the (2-2)th output terminal G20(2nd). The fourth output capacitor CQ1 may have a first electrode connected to the gate electrode of the (6-4)th transistor T6_4 and the fourth QN node QN4 which is the second electrode of the fourth stabilization transistor TBV4, and a second electrode connected to the (2-2)th output terminal G20(2nd).

As shown in FIGS. 22 and 23, the integrated scan signal generation circuit SCN[G1] according to the embodiment may operate based on a (1-1)th clock signal G1 Clk1, a (2-1)th clock signal G1 Clk2, a (1-2)th clock signal G2 Clk1, a (2-2)th clock signal G2 Clk2, a (4-2)th clock signal G2 Clk4, and a (6-2)th clock signal G2 Clk6. In one embodiment, a (3-1)th clock signal G1 Clk3, a (3-2)th clock signal G2 Clk3, a (4-1)th clock signal G1 Clk4, a (5-2)th clock signal G2 Clk5 can correspond to clock signals that are applied to one or more scan signal generation circuits at a previous stage or a subsequent stage.

A relationship between clock signals for driving the integrated scan signal generation circuit SCN[G1] according to the embodiment will be described as follows.

The (1-1)th clock signal G1 Clk1, the (2-1)th clock signal G1 Clk2, the (3-1)th clock signal G1 Clk3, and the (4-1)th clock signal G1 Clk4 can generate a low voltage for a time close to one horizontal period (1H). The (1-2)th clock signal G2 Clk1, the (2-2)th clock signal G2 Clk2, the (3-2)th clock signal G2 Clk3, the (4-2)th clock signal G2 Clk4, the (5-2)th clock signal G2 Clk5, and the (6-2)th clock signal G2 Clk6 can generate a low voltage for a time close to 2 horizontal periods (2H).

The (4-1)th clock signal G1 Clk4 may be changed from a high voltage to a low voltage after the (6-2)th clock signal G2 Clk6 is changed from the high voltage to the low voltage. The (1-1)th clock signal G1 Clk1 may be changed from the high voltage to the low voltage after the (1-2)th clock signal G2 Clk1 is changed from the high voltage to the low voltage. The (2-1)th clock signal G1 Clk2 may be changed from the high voltage to the low voltage after the (2-2)th clock signal G2 Clk2 is changed from the high voltage to the low voltage. The (3-1)th clock signal G1 Clk3 may be changed from the high voltage to the low voltage after the (3-2)th clock signal G2 Clk3 is changed from the high voltage to the low voltage.

Periods during which the (4-1)th clock signal G1 Clk4, the (1-1)th clock signal G1 Clk1, the (2-1)th clock signal G1 Clk2, and the (3-1)th clock signal G1 Clk3 maintain the low voltage may not overlap. On the other hand, periods during which the (6-2)th clock signal G2 Clk6 and the (1-2)th clock signal G2 Clk1 maintain the low voltage may overlap, periods during which the (1-2)th clock signal G2 Clk1 and the (2-2)th clock signal G2 Clk1 maintain the low voltage may overlap, periods during which the (2-2)th clock signal G2 Clk2 and the (3-2)th clock signal G2 Clk3 maintain the low voltage may overlap, periods during which the (3-2)th clock signal G2 Clk3 and the (4-2)th clock signal G2 Clk4 maintain the low voltage may overlap, and periods during which the (4-2)th clock signal G2 Clk4 and the (5-2)th clock signal G2 Clk5 maintain the low voltage may overlap. For example, a period in which the (1-1)th clock signal G1 Clk1 maintains the second state (e.g., low voltage state) and a period in which the (2-1)th clock signal G1 Clk2 maintains the second state may not overlap, and a period in which the (1-2)th clock signal G2 Clk1 maintains the second state and a period in which the (2-2)th clock signal G2 Clk2 maintains the second state may at least partially overlap.

A method of driving the integrated scan signal generation circuit SCN[G1] according to the embodiment will be described below based on the clock signals described above. However, since the operation of the switch circuit SWTR has been previously described with reference to FIGS. 16 to 20, the operation of the output circuit OUTBF and scan signals output therefrom will be mainly described. In addition, the switch circuit SWTR will be described on the assumption that the common QN node has been charged with a low voltage by the start signal applied through the start signal line VST and the (6-2)th clock signal G2 Clk6 applied through the (6-2)th clock signal line G2CLK6.

As shown in FIGS. 22 and 23, when the QB node QBN has been charged with a high voltage (refer to QBn in FIG. 23), the common QN node QNC may be in a state in which it has been charged with a low voltage (period Qnc Low). This can be ascertained by referring to charged states (Qn1 to Qn4 in FIG. 23) of the first QN node QN1 to the fourth QN node QN4. Thus, responsive to receiving the (6-2)th clock signal G2 Clk6 and the start signal line VST that transitions from a first state (e.g., high logic state) to a second state (e.g., low logic state) at a first time, the switch circuit SWTR may be configured to charge one or more QN nodes (e.g., QN1 through QN4) for a first gate line GL1 and a second gate line GL2 of the display panel from a first state (e.g., high logic state) to a second state (e.g., low logic state).

The (6-1)th transistor T6_1 may be turned on in response to a voltage Qn1 charged in the first QN node QN1 that is the second electrode of the first stabilization transistor TBV1. When the (1-1)th clock signal G1 Clk1 applied through the (1-1)th clock signal line G1CLK1 is changed from a high voltage to a low voltage in a state in which the (6-1)th transistor T6_1 is turned on, bootstrapping due to the first output capacitor CQ1 may occur in the first QN node QN1.

Accordingly, the voltage Qn1 of the first QN node QN1 may be lowered to the level of the gate low voltage. In addition, the low voltage of the (1-1)th clock signal G1 Clk1 may be output through the (1-1)th output terminal G1o(1st) via the turned on (6-1)th transistor T6_1. Since the low voltage output through the (1-1)th output terminal G10(1st) corresponds to the first scan signal Scan1[n] in FIG. 7, it may be used as a first scan signal G1(1st) to be applied to the first horizontal line 1st. Since the first scan signal G1(1st) to be applied to the first horizontal line 1st is output through the (1-1)th output terminal G10(1st), it may be defined as a (1-1)th scan signal G1(1st).

The (6-2)th transistor T6_2 may be turned on in response to a voltage Qn2 charged in the second QN node QN2 that is the second electrode of the second stabilization transistor TBV2. When the (1-2)th clock signal G2 Clk1 applied through the (1-2)th clock signal line G2CLK1 is changed from the high voltage to the low voltage in a state in which the (6-2)th transistor T6_2 is turned on, bootstrapping due to the second output capacitor CQ2 may occur in the second QN node QN2.

Accordingly, the voltage Qn2 of the second QN node QN2 may be lowered to the level of the gate low voltage. In addition, the low voltage of the (1-2)th clock signal G2 Clk1 may be output through the (1-2)th output terminal G20(1st) via the turned on (6-2)th transistor T6_2. Since the low voltage output through the (1-2)th output terminal G20(1st) corresponds to the second scan signal Scan2[n] in FIG. 7, it may be used as a second scan signal G2(1st) to be applied to the first horizontal line 1st. Since the second scan signal G2(1st) to be applied to the first horizontal line 1st is output through the (1-2)th output terminal G20(1st), it may be defined as a (1-2)th scan signal G2(1st).

In other words, the output circuit OUTBF may be configured to receive at least one first clock signal (e.g., (1-1)th clock signal and/or (1-2)th clock signal), and responsive to the first clock signal transitioning from a first state (e.g., high logic state) to a second state (e.g., low logic state) at a second time after the first time, the output circuit OUTBF may be configured to transition at least a first gate signal (e.g., first scan signal or second scan signal) applied to the first gate line GL1 to a second state (e.g., low logic state).

The (6-3)th transistor T6_3 may be turned on in response to a voltage Qn3 charged in the third QN node QN3 that is the second electrode of the third stabilization transistor TBV3. When the (2-1)th clock signal G1 Clk2 applied through the (2-1)th clock signal line G1CLK2 is changed from the high voltage to the low voltage in a state in which the (6-3)th transistor T6_3 is turned on, bootstrapping due to the third capacitor CQ3 may occur in the third QN node.

Accordingly, the voltage Qn3 of the third QN node QN3 may be lowered to the level of the gate low voltage. In addition, the low voltage of the (2-1)th clock signal G1 Clk2 may be output through the (2-1)th output terminal G10(2nd) via the turned on (6-3)th transistor T6_3. Since the low voltage output through the (2-1)th output terminal G10(2nd) is similar to the first scan signal Scan1[n] in FIG. 7, it may be used as a first scan signal G1(2nd) to be applied to the second horizontal line 2nd. Since the first scan signal G1(2nd) to be applied to the second horizontal line 2nd is output through the (2-1)th output terminal G10(2nd), it may be defined as a (2-1)th scan signal G1(2nd).

The (6-4)th transistor T6_4 may be turned on in response to a voltage Qn4 charged in the fourth QN node QN4 that is the second electrode of the fourth stabilization transistor TBV4. When the (2-2)th clock signal G2 Clk2 applied through the (2-2)th clock signal line G2CLK2 is changed from the high voltage to the low voltage in a state in which the (6-4)th transistor T6_4 is turned on, bootstrapping due to the fourth output capacitor CQ4 may occur in the fourth QN node QN4.

Accordingly, the voltage Qn4 of the fourth QN node QN4 may be lowered to the level of the gate low voltage. In addition, the low voltage of the (2-2)th clock signal G2 Clk2 may be output through the (2-2)th output terminal G20(2nd) via the turned on (6-4)th transistor T6_4. Since the low voltage output through the (2-2)th output terminal G20(2nd) is similar to the second scan signal Scan2[n] in FIG. 7, it may be used as a second scan signal G2(2nd) to be applied to the second horizontal line 2nd. Since the second scan signal G2(2nd) to be applied to the second horizontal line 2nd is output through the (2-2)th output terminal G20(2nd), it may be defined as a (2-2)th scan signal G2(2nd).

In other words, the output circuit OUTBF may be configured to receive at least one second clock signal (e.g., (2-1)th clock signal and/or (2-2)th clock signal), and responsive to the second clock signal transitioning from a first state (e.g., high logic state) to a second state (e.g., low logic state) at a third time after the second time, the output circuit OUTBF may be configured to transition at least a second gate signal (e.g., first scan signal or second scan signal) applied to the second gate line GL2 to a second state (e.g., low logic state).

A period in which the low voltage of the (1-1)th scan signal G1(1st) maintained and a period in which the low voltage of the (2-1)th scan signal G1(2nd) is maintained may not overlap. On the other hand, a period in which the low voltage of the (1-2)th scan signal G2(1st) is maintained and a period in which the low voltage of the (2-2)th scan signal G2(2nd) is maintained may partially overlap. In one instance, the (1-1)th scan signal transitions to a second state (e.g., low voltage state) at a later time than when the (1-2)th scan signal transitions to a second state, and the (1-1)th scan signal transitions to a first state (e.g., high voltage state) from the second state at an earlier time than when the (1-2)th scan signal transitions to the first state from the second state.

The state in which the common QN node QNC is charged with the low voltage may be maintained until a period in which the (2-4)th clock signal G2 Clk4 applied through the (2-4)th clock signal line G2CLK4 is changed from the high voltage to the low voltage.

Thereafter, when the (2-4)th clock signal G2 Clk4 applied through the (2-4)th clock signal line G2CLK4 is changed from the high voltage to the low voltage, the QB node QBN is charged with the gate low voltage and the third Transistor T3 can be turned on. When the third transistor T3 is turned on, the common QN node QNC can be charged with the gate high voltage and the (6-1)th transistors T6_1 to the (6-4)th transistors T6_4 may be turned off. On the other hand, the (7-1)th transistor T7_1 to the (7-4)th transistor T7_4 are turned on, and thus the gate high voltage can be output to the (1-1)th output terminal G10(1st), the (2-1)th output terminal G20(1st), the (1-2)th output terminal G10(2nd) and the (2-2)th output terminal G20(2nd).

Therefore, the scan signal generation circuit SCN described herein can provide gate signals to at least first and second gate lines of a display panel. While the embodiments have been described with respect to a scan signal generation circuit that provides a first scan signal SCN1 and a second signal SCN2 for a first horizontal line and a first scan signal SCN1 and a second scan signal SCN2 for a second horizontal line based on the configuration of the subpixel shown in FIG. 6, it is appreciated that the scan signal generation circuit described herein can be applied to subpixels with different configurations and number of gate signals. For example, a subpixel of the display panel may be configured to receive one scan signal as a gate signal instead of two scan signals, and the scan signal generation circuit can provide a first gate signal to a first horizontal line and a second gate signal to a second horizontal line, where each of the first gate signal and the second gate signal includes one scan signal.

As described above, the present disclosure has the effect of reducing the circuit area of a shift register for outputting scan signals by grouping and integrating a total of four scan signal generators included in the two stages to form a single integrated scan signal generation circuit. In addition, the present disclosure has the effect of reducing the size of a bezel of the display panel based on reduction in the circuit area of the shift register for outputting scan signals.

The present disclosure can reduce the circuit area of a shift register for outputting a scan signal by grouping and integrating a total of four scan signal generators included in two stages to construct one integrated scan signal generation circuit. Further, the present disclosure can reduce the size of a bezel of a display panel according to reduction in the circuit area of the shift register for outputting a scan signal.

What is claimed is:

1. A display device comprising:
 a display panel; and
 a scan signal generator configured to generate a (1-1)th scan signal and a (1-2)th scan signal to be supplied to a first horizontal line of the display panel and a (2-1)th scan signal and a (2-2)th scan signal to be supplied to a second horizontal line of the display panel,
 wherein the scan signal generator includes:
 a switch circuit including a common node charged with a low voltage applied by turn-on operations of a first transistor and a second transistor, an inverting node operating opposite to the common node, and first to fourth stabilization transistors having first electrodes connected to the common node, and gate electrodes connected to a gate low voltage line; and
 an output circuit including a (1-1)th pull-up transistor and a (1-2)th pull-up transistor that output the (1-1)th scan signal and the (1-2)th scan signal in response to a voltage of a first node corresponding to a second electrode of the first stabilization transistor and a voltage of a second node corresponding to a second electrode of the second stabilization transistor, and a (2-1)th pull-up transistor and a (2-2)th pull-up transistor that output the (2-1)th scan signal and the (2-2)th scan signal in response to a voltage of a third node corresponding to a second electrode of the third stabilization transistor and a voltage of a fourth node corresponding to a second electrode of the fourth stabilization transistor.

2. The display device of claim 1, wherein the (1-1)th pull-up transistor has a gate electrode connected to the first node, a first electrode connected to a (1-1)th clock signal line, and a second electrode connected to a (1-1)th output terminal, the (1-2)th pull-up transistor has a gate electrode connected to the second node, a first electrode connected to a (1-2)th clock signal line, and a second electrode connected to a (1-2)th output terminal, the (2-1)th pull-up transistor has a gate electrode connected to the third node, a first electrode connected to a (2-1)th clock signal line, and a second electrode connected to a (2-1)th output terminal, and the (2-2)th pull-up transistor has a gate electrode connected to the fourth node, a first electrode connected to a (2-2)th clock signal line, and a second electrode connected to a (2-2) output terminal.

3. The display device of claim 2, wherein the output circuit includes:

a (1-1)th pull-down transistor having a gate electrode connected to the inverting node, a first electrode connected to a gate high voltage line, and a second electrode connected to the (1-1)th output terminal;

a (1-2)th pull-down transistor having a gate electrode connected to the inverting node, a first electrode connected to the gate high voltage line, and a second electrode connected to the (1-2)th output terminal;

a (2-1)th pull-down transistor having a gate electrode connected to the inverting node, a first electrode connected to the gate high voltage line, and a second electrode connected to the (2-1)th output terminal; and a (2-2)th pull-down transistor having a gate electrode connected to the inverting node, a first electrode connected to the gate high voltage line, and a second electrode connected to the (2-2)th output terminal.

4. The display device of claim 3, wherein the output circuit includes:

a (1-1)th capacitor having a first electrode connected to the gate electrode of the (1-1)th pull-up transistor and a second electrode connected to the (1-1)th output terminal;

a (1-2)th capacitor having a first electrode connected to the gate electrode of the (1-2)th pull-up transistor and a second electrode connected to the (1-2)th output terminal;

a (2-1)th capacitor having a first electrode connected to the gate electrode of the (2-1)th pull-up transistor and a second electrode connected to the (2-1)th output terminal; and a (2-2)th capacitor having a first electrode connected to the gate electrode of the (2-2)th pull-up transistor and a second electrode connected to the (2-2)th output terminal.

5. The display device of claim 1, wherein the first transistor has a gate electrode connected to a start signal line and a first electrode connected to the gate low voltage line, and the second transistor has a gate electrode connected to a common node clock signal line, a first electrode connected to a second electrode of the first transistor, and a second electrode connected to the common node.

6. The display device of claim 5, wherein the switch circuit includes:

a third transistor having a gate electrode connected to the inverting node, a first electrode connected to the gate high voltage line, and a second electrode connected to the common node;

a fourth transistor having a gate electrode connected to an inverting node clock signal line, a first electrode connected to the gate low voltage line, and a second electrode connected to the inverting node;

a fifth transistor having a gate electrode connected to the start signal line, a first electrode connected to the gate high voltage line, and a second electrode connected to the inverting node;

an eighth transistor having a gate electrode connected to the common node, a first electrode connected to the gate high voltage line, and a second electrode connected to the common node;

a ninth transistor having a gate electrode connected to a reset signal line, a first electrode connected to the gate high voltage line, and a second electrode connected to the common node; and a node capacitor having a first electrode connected to the gate high voltage line and a second electrode connected to the inverting node.

7. The display device of claim 1, wherein a period in which the (1-1)th scan signal maintains a low voltage and a period in which the (2-1)th scan signal maintains a low voltage do not overlap, and a period in which the (1-2)th scan signal maintains a low voltage and a period in which the (2-2)th scan signal maintains a low voltage partially overlap.

8. A scan signal generation circuit comprising:

a switch circuit including a common node charged with a low voltage applied by turn-on operations of a first transistor and a second transistor, an inverting node operating opposite to the common node, and first to fourth stabilization transistors having first electrodes connected to the common node, and gate electrodes connected to a gate low voltage line; and an output circuit including a (1-1)th pull-up transistor and a (1-2)th pull-up transistor that output the (1-1)th scan signal and the (1-2)th scan signal in response to a voltage of a first node corresponding to a second electrode of the first stabilization transistor and a voltage of a second node corresponding to a second electrode of the second stabilization transistor, and a (2-1)th pull-up transistor and a (2-2)th pull-up transistor that output the (2-1)th scan signal and the (2-2)th scan signal in response to a voltage of a third node corresponding to a second electrode of the third stabilization transistor and a voltage of a fourth node corresponding to a second electrode of the fourth stabilization transistor.

9. The scan signal generation circuit of claim 8, wherein the (1-1)th pull-up transistor has a gate electrode connected to the first node, a first electrode connected to a (1-1)th clock signal line, and a second electrode connected to a (1-1)th output terminal, the (1-2)th pull-up transistor has a gate electrode connected to the second node, a first electrode connected to a (1-2)th clock signal line, and a second electrode connected to a (1-2)th output terminal, the (2-1)th pull-up transistor has a gate electrode connected to the third node, a first electrode connected to a (2-1)th clock signal line, and a second electrode connected to a (2-1)th output terminal, and the (2-2)th pull-up transistor has a gate electrode connected to the fourth node, a first electrode connected to a (2-2)th clock signal line, and a second electrode connected to a (2-2)th output terminal.

10. The scan signal generation circuit of claim 9, wherein the output circuit includes:

a (1-1)th pull-down transistor having a gate electrode connected to the inverting node, a first electrode connected to a gate high voltage line, and a second electrode connected to the (1-1)th output terminal;

a (1-2)th pull-down transistor having a gate electrode connected to the inverting node, a first electrode connected to the gate high voltage line, and a second electrode connected to the (1-2)th output terminal;

a (2-1)th pull-down transistor having a gate electrode connected to the inverting node, a first electrode connected to the gate high voltage line, and a second electrode connected to the (2-1)th output terminal;

a (2-2)th pull-down transistor having a gate electrode connected to the inverting node, a first electrode connected to the gate high voltage line, and a second electrode connected to the (2-2)th output terminal;

a (1-1)th capacitor having a first electrode connected to the gate electrode of the (1-1)th pull-up transistor and a second electrode connected to the (1-1)th output terminal;

a (1-2)th capacitor having a first electrode connected to the gate electrode of the (1-2)th pull-up transistor and a second electrode connected to the (1-2)th output terminal;

a (2-1)th capacitor having a first electrode connected to the gate electrode of the (2-1)th pull-up transistor and a second electrode connected to the (2-1)th output terminal; and a (2-2)th capacitor having a first electrode connected to the gate electrode of the (2-2)th pull-up transistor and a second electrode connected to the (2-2)th output terminal.

11. A scan signal generation circuit, comprising:

a switch circuit configured to receive a (6-2)th clock signal applied to a common node clock signal line, wherein responsive to the (6-2)th clock signal transitioning from a first state to a second state at a first time, the switch circuit is configured to charge one or more QN nodes for a first gate line and a second gate line of a display panel from a first state to a second state; and an output circuit connected to the one or more QN nodes, the output circuit configured to receive at least one first clock signal and at least one second clock signal, wherein responsive to the first clock signal transitioning from a first state to a second state at a second time after the first time, the output circuit is configured to transition a first gate signal applied to the first gate line to a second state, and responsive to the second clock signal transitioning from a first state to a second state at a third time after the second time, transition a second gate signal applied to the second gate line to a second state.

12. The scan signal generation circuit of claim 11, wherein the switch circuit and the output circuit are formed in a single integrated circuit.

13. The scan signal generation circuit of claim 11, wherein the first gate line includes a first scan signal line configured to output a (1-1)th scan signal and a second scan signal line configured to output a (1-2)th scan signal for a first row of pixels in the display panel, and the second gate line includes a first scan signal line configured to output a (2-1)th scan signal and a second scan signal line configured to output a (2-2)th scan signal for a second row of pixels of the display panel.

14. The scan signal generation circuit of claim 13,
wherein the (1-1)th scan signal transitions to a second state at a later time than when the (1-2)th scan signal transitions to a second state, and wherein the (1-1)th scan signal transitions to a first state from the second state at an earlier time than when the (1-2)th scan signal transitions to a first state from the second state.

15. The scan signal generation circuit of claim 13, wherein the one or more QN nodes includes first to fourth QN nodes, and the switch circuit includes a first stabilization transistor connected to the first QN node, a second stabilization transistor connected to the second QN node, a third stabilization transistor connected to the third QN node, and a fourth stabilization transistor connected to the fourth QN node.

16. The scan signal generation circuit of claim 15, wherein the output circuit includes a (1-1)th pull-up transistor connected to the first QN node and the first scan signal line of the first gate line, a (1-2)th pull-up transistor connected to the second QN node and the second scan signal line of the first gate line, a (2-1)th pull-up transistor connected to the third QN node and the first scan signal line of the second gate line, and a (2-2)th pull-up transistor connected to the fourth QN node and the second scan signal line of the second gate line.

17. The scan signal generation circuit of claim 16,
wherein the at least one first clock signal includes a (1-1)th clock signal and a (1-2)th clock signal, and the at least second clock signal includes a (2-1)th clock signal and a (2-2)th clock signal,
wherein responsive to the (1-1)th clock signal transitioning to the second state, the (1-1)th pull-up transistor is configured to transition the (1-1)th scan signal to the second state, responsive to the (1-2)th clock signal transitioning to the second state, the (1-2)th pull-up transistor is configured to transition the (1-2)th scan signal to the second state, responsive to the (2-1)th pull-up transistor is configured to transition the (2-1)th scan signal to the second state, and responsive to the (2-2)th clock signal transitioning to the second state, the (2-2)th pull-up transistor is configured to transition the (2-2)th scan signal to the second state.

18. The scan signal generation circuit of claim 17, wherein a period in which the (1-1)th clock signal maintains the second state and a period in which the (2-1)th clock signal maintains the second state do not overlap, and a period in which the (1-2)th clock signal maintains the second state and a period in which the (2-2)th clock signal maintains the second state partially overlap.

19. The scan signal generation circuit of claim 17, wherein a period in which the (1-1)th scan signal maintains the second state and a period in which the (2-1)th scan signal maintains the second state do not overlap, and a period in which the (1-2)th scan signal maintains the second state and a period in which the (2-2)th scan signal maintains the second state partially overlap.

20. The scan signal generation circuit of claim 11, wherein the one or more QN nodes includes at least a first QN node and a second QN node, and wherein responsive to the first clock signal transitioning to the second state at the second time, a voltage at the first QN node transitions from the second state to a third state, and responsive to the second clock signal transitioning to the second state at the third time, a voltage at the second QN node transitions from the second state to a third state.

21. The scan signal generation circuit of claim 11, wherein each of the first gate line and the second gate line are connected to one or more p-type transistors, and the first gate signal and the second gate signal transitions to the second state that is a low logical state.

22. A display device comprising:
a display panel; and
a scan signal generator configured to generate a (1-1)th scan signal and a (1-2)th scan signal to be supplied to a first horizontal line of the display panel and a (2-1)th scan signal and a (2-2)th scan signal to be supplied to a second horizontal line of the display panel,
wherein the scan signal generator includes:

an first circuit including a first transistor configured to output the (1-1)th scan signal, a second transistor configured to output the (1-2)th scan signal, a third transistor configured to output the (2-1)th scan signal, and a fourth transistor configured to output the (2-2)th scan signal; and a second circuit including stabilization transistors configured to control the first transistor, the second transistor, the third transistor, and the fourth transistor based on a voltage of a common node charged with a first voltage in response to a signal applied to a node electrically connected to the common node.

23. The display device of claim 22,
wherein the switch circuit further comprises the common node charged with the first voltage in response to the signal applied to the node and an inverting node that transitions to a second voltage of an opposite logical state than the first voltage.

24. The display device of claim 22,
wherein the stabilization transistors turned on by a gate low voltage applied through a gate low voltage line.

25. The display device of claim 24,
wherein the stabilization transistors includes a first stabilization transistor, a second stabilization transistor, a third stabilization transistor and a fourth stabilization transistor, and the first stabilization transistor including a gate electrode connected to the gate low voltage line, a first electrode connected to the common node, and a second electrode connected to a first node corresponding to the gate electrode of the first transistor.

26. The display device of claim 25,
wherein the switch circuit further includes:
a fifth transistor and a sixth transistor configured to control the common node, and
a seventh transistor and a eighth transistor configured to control the inverting node,
wherein the first node is charged to the first voltage or charged to a second voltage in response to an operation of the first transistor.

* * * * *